United States Patent [19]
Horiguchi et al.

[11] Patent Number: 5,966,336
[45] Date of Patent: *Oct. 12, 1999

[54] SEMICONDUCTOR DEVICE HAVING REDUNDANCY CIRCUIT

[75] Inventors: Masashi Horiguchi, Kawasaki; Jun Etoh, Hachioji; Masakazu Aoki, Tokorozawa; Kiyoo Itoh, Higashikurume, all of Japan

[73] Assignee: Hitachi, Ltd., Tokyo, Japan

[*] Notice: This patent is subject to a terminal disclaimer.

[21] Appl. No.: 09/144,258

[22] Filed: Aug. 31, 1998

Related U.S. Application Data

[63] Continuation of application No. 08/825,605, Mar. 31, 1997, Pat. No. 5,815,448, which is a continuation of application No. 08/535,574, Sep. 27, 1995, Pat. No. 5,617,365, which is a continuation of application No. 08/155,848, Nov. 23, 1993, abandoned, which is a division of application No. 07/818,434, Dec. 27, 1991, Pat. No. 5,265,055, which is a continuation of application No. 07/419,399, Oct. 10, 1989, abandoned.

[30] Foreign Application Priority Data

Oct. 7, 1988 [JP] Japan .................................. 63-252028
Oct. 31, 1988 [JP] Japan .................................. 63-275375

[51] Int. Cl.$^6$ ..................................................... G11C 7/00
[52] U.S. Cl. ................ 365/200; 365/225.7; 365/230.02; 365/230.03; 365/230.06; 371/10.2; 371/10.3
[58] Field of Search ............................. 365/200, 230.03, 365/230.01, 230.04, 230.06, 225.7, 230.02; 371/10.2, 10.3, 8.1, 10.1

[56] References Cited

U.S. PATENT DOCUMENTS

| | | | |
|---|---|---|---|
| 4,389,715 | 6/1983 | Eaton, Jr. et al. ...................... | 365/200 |
| 4,648,075 | 3/1987 | Segawa et al. .......................... | 365/200 |
| 4,656,610 | 4/1987 | Yoshida et al. .......................... | 365/200 |
| 4,675,845 | 6/1987 | Itoh et al. ................................ | 365/51 |
| 4,727,516 | 2/1988 | Yoshida et al. .......................... | 365/200 |
| 4,837,747 | 6/1989 | Dosaka et al. ...................... | 365/200 X |
| 5,265,055 | 11/1993 | Horiguchi et al. ...................... | 365/200 |
| 5,617,365 | 4/1997 | Horiguchi et al. ...................... | 365/200 |
| 5,815,448 | 9/1998 | Horiguchi et al. ...................... | 365/200 |

FOREIGN PATENT DOCUMENTS

| | | |
|---|---|---|
| 59-135700 | 8/1984 | Japan . |
| 60-130139 | 11/1985 | Japan . |
| 62-40700 | 2/1987 | Japan . |

OTHER PUBLICATIONS

IEEE Journal of Solid–State Curcuits, vol. SC–16, No. 5, Oct. 1981, pp. 479–487.

IEE Proc., vol. 130, Pt. I, No. 3, Jun. 1983, pp. 127–135.

1984 IEEE International Solid–State Circuits Conference, Digest of Technical Papers, pp. 282–283.

IEEE Journal of Solid–State Circuits, vol. 26, No. 1, Jan. 1991, pp. 12–17.

Primary Examiner—Do Hyun Yoo
Attorney, Agent, or Firm—Antonelli, Terry, Stout & Kraus, LLP

[57] ABSTRACT

A redundancy technique is introduced for a semiconductor memory and, more particularly, a redundancy technique for a memory, for example, a dynamic random access memory (DRAM) having a memory array which is divided into memory mats and a storage capacity of 16 mega bits or more. According to the present redundancy technique, for a semiconductor memory including a memory array which has a plurality of word lines, a plurality of bit lines arranged so that two-level crossings are formed between the word lines and the bit lines, memory cells disposed at desired ones of the two-level crossings, and spare bit lines, there is provided a redundancy circuit having a memory for storing therein a defective address existing in the memory array and comparing an address to be accessed with the stored defective address. Each of the address comparing circuits has stored therein the column address of a defective bit line and a part of the row address indicating the memory mat corresponding to the defective bit line.

12 Claims, 34 Drawing Sheets

FIG. 8
PRIOR ART

| VALUE STORED IN ADDRESS COMPARE CIRCUIT | INPUT ADDRESS | RESULT OF COMPARISON |
|---|---|---|
| "0" | "0" | COINCIDENT |
| | "1" | NOT COINCIDENT |
| "1" | "0" | NOT COINCIDENT |
| | "1" | COINCIDENT |
| "X" | "0" | COINCIDENT |
| | "1" | COINCIDENT |

FIG. 22

| ADDRESS | | COMPARED/ NOT COMPARED | | |
|---|---|---|---|---|
| ROW ADDRESS | $A_X(0)$ | ○ | × | × |
| | $A_X(1)$ | ○ | ○ | × |
| | $A_X(2)$ | ○ | ○ | × |
| | ⋮ | ⋮ | ⋮ | ⋮ |
| | $A_X(n_W-3)$ | ○ | ○ | × |
| | $A_X(n_W-2)$ | ○ | ○ | × |
| | $A_X(n_W-1)$ | ○ | ○ | × |
| COLUMN ADDRESS | $A_Y(0)$ | ○ | ○ | ○ |
| | $A_Y(1)$ | ○ | ○ | ○ |
| | $A_Y(2)$ | ○ | ○ | ○ |
| | ⋮ | ⋮ | ⋮ | ⋮ |
| | $A_Y(n_B-3)$ | ○ | ○ | ○ |
| | $A_Y(n_B-2)$ | ○ | ○ | ○ |
| | $A_Y(n_B-1)$ | ○ | ○ | ○ |
| NUMBER OF BITS REPLACED AT A TIME | | 1 | 2 | $N_W$ |

○ : COMPARED
× : NOT COMPARED

FIG. 25

| ADDRESS | | | | | | | |
|---|---|---|---|---|---|---|---|
| ROW ADDRESS | Ax(0) | ○ | × | ○ | × | × | × |
| | Ax(1) | ○ | ○ | ○ | ○ | × | × |
| | Ax(2) | ○ | ○ | ○ | ○ | × | × |
| | ⋮ | ⋮ | ⋮ | ⋮ | ⋮ | ⋮ | ⋮ |
| | Ax(nw−3) | ○ | ○ | ○ | ○ | × | × |
| | Ax(nw−2) | ○ | ○ | ○ | ○ | × | × |
| | Ax(nw−1) | ○ | ○ | ○ | ○ | × | × |
| COLUMN ADDRESS | Ay(0) | ○ | ○ | × | × | ○ | × |
| | Ay(1) | ○ | ○ | ○ | ○ | ○ | ○ |
| | Ay(2) | ○ | ○ | ○ | ○ | ○ | ○ |
| | ⋮ | ⋮ | ⋮ | ⋮ | ⋮ | ⋮ | ⋮ |
| | Ay(nB−3) | ○ | ○ | ○ | ○ | ○ | ○ |
| | Ay(nB−2) | ○ | ○ | ○ | ○ | ○ | ○ |
| | Ay(nB−1) | ○ | ○ | ○ | ○ | ○ | ○ |
| NUMBER OF BITS REPLACED AT A TIME | | 1 | 2 | 2 | 4 | Nw | 2Nw |

○ : COMPARED
× : NOT COMPARED

FIG. 27

| ADDRESS | | COMPARED / NOT COMPARED | | | |
|---|---|---|---|---|---|
| ROW ADDRESS | Ax(0) | ○ | × | × | × |
| | Ax(1) | ○ | ○ | × | × |
| | Ax(2) | ○ | ○ | × | × |
| | ⋮ | ⋮ | ⋮ | ⋮ | ⋮ |
| | Ax(nw−3) | ○ | ○ | × | × |
| | Ax(nw−2) | ○ | ○ | ○ | × |
| | Ax(nw−1) | ○ | ○ | ○ | × |
| COLUMN ADDRESS | Ay(0) | ○ | ○ | ○ | ○ |
| | Ay(1) | ○ | ○ | ○ | ○ |
| | Ay(2) | ○ | ○ | ○ | ○ |
| | ⋮ | ⋮ | ⋮ | ⋮ | ⋮ |
| | Ay(nB−3) | ○ | ○ | ○ | ○ |
| | Ay(nB−2) | ○ | ○ | ○ | ○ |
| | Ay(nB−1) | ○ | ○ | ○ | ○ |
| NUMBER OF BITS REPLACED AT A TIME | | 1 | 2 | $\frac{N_W}{4}$ | $N_W$ |

○ : COMPARED
× : NOT COMPARED

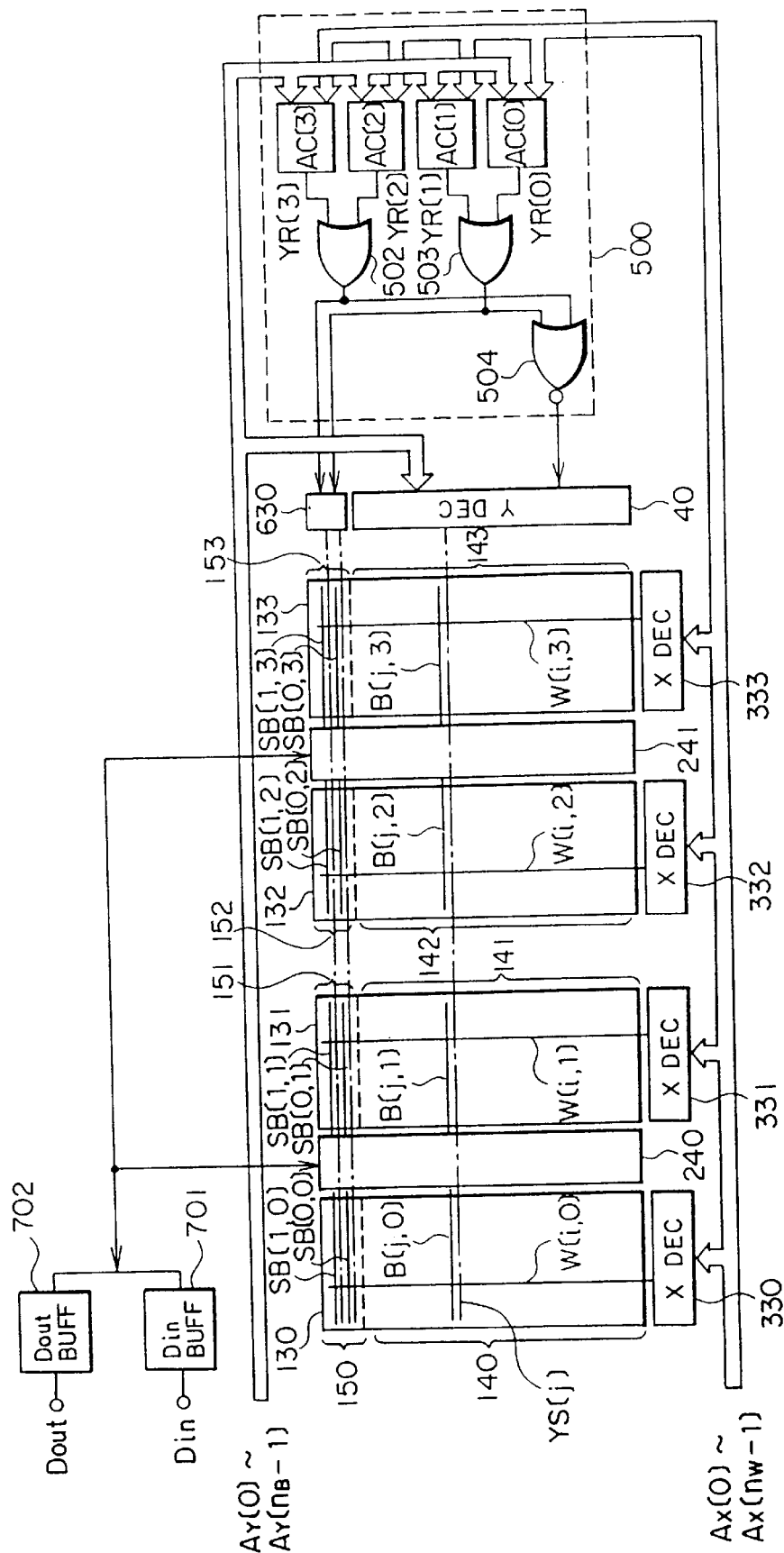
F I G. 28

FIG. 29

| ADDRESS | | | | | | |
|---|---|---|---|---|---|---|
| | | \multicolumn{5}{c}{COMPARED / NOT COMPARED} |
| ROW ADDRESS | Ax(0) | ○ | × | × | × | × |
| | Ax(1) | ○ | ○ | × | × | × |
| | Ax(2) | ○ | ○ | × | × | × |
| | ⋮ | ⋮ | ⋮ | ⋮ | ⋮ | ⋮ |
| | Ax(nw−3) | ○ | ○ | × | × | × |
| | Ax(nw−2) | ○ | ○ | ○ | × | × |
| | Ax(nw−1) | ○ | ○ | ○ | ○ | × |
| COLUMN ADDRESS | Ay(0) | ○ | ○ | ○ | ○ | ○ |
| | Ay(1) | ○ | ○ | ○ | ○ | ○ |
| | Ay(2) | ○ | ○ | ○ | ○ | ○ |
| | ⋮ | ⋮ | ⋮ | ⋮ | ⋮ | ⋮ |
| | Ay(nB−3) | ○ | ○ | ○ | ○ | ○ |
| | Ay(nB−2) | ○ | ○ | ○ | ○ | ○ |
| | Ay(nB−1) | ○ | ○ | ○ | ○ | ○ |
| NUMBER OF BITS REPLACED AT A TIME | | 1 | 2 | $\frac{Nw}{4}$ | $\frac{Nw}{2}$ | $Nw$ |

○ : COMPARED
× : NOT COMPARED

SEMICONDUCTOR DEVICE HAVING REDUNDANCY CIRCUIT

CROSS-REFERENCE TO RELATED APPLICATIONS

This application is a continuation of application Ser. No. 08/825,605, filed Mar. 31, 1997, now U.S. Pat. No. 5,815,448; which, in turn, is a continuation of application Ser. No. 08/535,574, filed Sep. 27, 1995, now U.S. Pat. No. 5,617,365; which, in turn, is a continuation of application Ser. No. 08/155,848, filed Nov. 23, 1993, now abandoned; which, in turn, is a divisional of application Ser. No. 07/818,434, filed Dec. 27, 1991, now U.S. Pat. No. 5,265,055; and which, in turn, is a continuation of application Ser. No. 07/419,399, filed Oct. 10, 1989, now abandoned; and the entire disclosures of which are incorporated herein by reference.

BACKGROUND OF THE INVENTION

The present invention relates to a semiconductor memory, and more particularly to a technique for repairing a semiconductor memory in such a manner that defective memory cells are replaced by spare memory cells.

In recent years, the level of integration of a semiconductor memory has been increased at high speed, and a semiconductor memory having a storage capacity of 1 mega bits has been mass-produced. However, as the level of integration of a semiconductor memory is made larger, each element is decreased in size, and the semiconductor chip is increased in area. Thus, there arises a problem that the manufacturing yields of the memory become correspondingly reduced. In order to solve the problem, the so-called redundancy technique is used, in which defective memory cells are replaced by spare memory cells already provided on a chip. As discussed on pages 479 to 487 of the IEEE Journal of Solid-State Circuits, Vol. SC-16, No. 5, October, 1981, the above technique is very effective for improving the manufacturing yields of a semiconductor memory.

In addition to the above technique, a redundancy method is proposed in JP-A-60-130,139, in which method a regular line in one of a plurality of memory mats can be replaced by a spare line in another memory mat. In this method, however, there arises the following problem. That is, in a case where a semiconductor memory is divided into a large number of memory mats, a complicated control operation is required to specify one of the memory mats. This is because a predetermined or another memory mat has to be selected in accordance with whether or not an address to be accessed is defective. Specifically in a case where a memory mat other than the predetermined memory mat is selected in a DRAM, it is required to operate a sense amplifier other than a predetermined sense amplifier. Thus, the access time associated with operation of the memory is increased.

SUMMARY OF THE INVENTION

FIG. 1A shows an example of a semiconductor memory which utilizes the redundancy technique and has been studied by the present inventors. In FIG. 1A, reference numeral 10 designates a memory array, in which memory cells are arranged so as to form a matrix. The memory array 10 is divided into a region 11 where regular memory cells are arranged, and a region 12 where spare memory cells are arranged. In the region 11, $N_W \times N_B$ memory cells are disposed at desired ones of two-level crossings of $N_W$ word lines W[i] (where i=0, 1, ... $N_W$−1) and $N_B$ bit lines B[j] (where j=0, 1, ... $N_B$−1). In the region 12, $L \times N_B$ memory cells (in the figure, L=4) are disposed at two-level crossings of L spare word lines SW[k] (where k=0, 1, ... L−1) and the $N_B$ bit lines. In a case where a folded bit line structure is used, each bit line is formed of two wiring conductors, but only one wiring conductor is shown in the figure for the sake of simplicity. Further, in FIG. 1A, reference numeral 20 designates sense amplifiers for amplifying the signals read out from memory cells and input/output lines for transferring data (or common signal lines in a case where only input or output data is sent), 30 an X-decoder applied with row address signals $A_X[i]$ (where i=0, 1, ... $n_W$−1, and $n_W = \log_2 N_W$) for selecting one of $N_W$ word lines, 40 a Y-decoder applied with column address signals $A_Y[j]$ (where j=0, 1, ... $n_B$−1, and $n_B = \log_2 N_B$) for selecting one of $N_B$ bit lines, 50 a redundancy control circuit, 60 a spare word line selection circuit applied with the output of the redundancy control circuit for selecting a spare word line, 701 a data input buffer, and 702 a data output buffer.

The present memory is provided with the redundancy control circuit for word lines. Accordingly, in a case where a regular word line is defective, the memory can be repaired in such a manner that the defective word line is replaced by one of the spare word lines with the aid of the redundancy control circuit 50 and the spare word line selection circuit 60. Further, L address comparing circuits AC[k] (where k=0, 1, ... L−1) are provided on a one-to-one basis for each spare word line. Each address comparing circuit stores therein the row address of a defective word line, and checks whether or not an address to be accessed is coincident with the stored address. When the address to be accessed is coincident with the stored address, the output XR[k] of the address comparing circuit AC[k] used is set at a high level. The spare word line selection circuit 60, as shown in FIG. 1B, includes L spare word drivers 650. Each of the spare word drivers 650 is activated when the output XR[k] of a corresponding address comparing circuit AC[k] has a high level. Thus, a corresponding spare word line SW[k] is selected in response to a word line drive signal $\Phi_X$ and the output of an NOR gate 501 is set at a low level thereby disabling the X-decoder 30. Accordingly, a regular word line which is to be selected, is never selected. That is, the regular word line is replaced by the spare word line SW[k].

FIG. 2A shows another example of a semiconductor memory which utilizes the redundancy technique and has been studied by the present inventors. In FIG. 2A, reference numeral 10 designates a memory array, in which memory cells are arranged so as to form a matrix. The memory array 10 is divided into a region 14 where regular memory cells are arranged, and a region 15 where spare memory cells are arranged. In the region 14, $N_W \times N_B$ memory cells are disposed at two-level crossings of $N_W$ word lines W[i] (where i=0, 1, ... $N_W$−1) and $N_B$ bit lines B[j] (where j=0, 1, ... $N_B$−1). In the region 15, $L \times N_W$ memory cells (in the figure, L=4) are disposed at two-level crossings of L spare bit lines SB[k] (where k=0, 1, ... L−1) and the $N_W$ word lines. Further, in FIG. 2A, reference numeral 20 designates sense amplifiers for amplifying the signals read out from memory cells and input/output lines for transferring data, 30 an X-decoder applied with row address signals $A_X[i]$ (where i=0, 1, ... $n_W$−1, and $n_W = \log_2 N_W$) for selecting one of $N_W$ word lines, 40 a Y-decoder applied with column address signals $A_Y[j]$ (where j=0, 1, ... $n_B$−1, and $n_B = \log_2 N_B$) for selecting one of $N_B$ bit lines, 50 a redundancy control circuit, and 63 a spare bit line selection circuit applied with the output of the redundancy control circuit for selecting a spare bit line.

The present memory is provided with the redundancy control circuit for bit lines. Accordingly, in a case where a regular bit line is defective, the memory can be repaired in such a manner that the defective bit line is replaced by one of the spare bit lines with the aid of the redundancy control circuit 50 and the spare bit line selection circuit 63. Further, L address comparing circuits AC[k] (where k=0, 1, . . . L−1) are provided on a one-to-one basis for each of L spare bit lines. Each address comparing circuit stores therein the column address of a defective bit line, and checks whether or not an address to be accessed is coincident with the stored address. When the address to be accessed is coincident with the stored address, the output YR[k] of the address comparing circuit AC[k] used is set at a high level. The spare bit line selection circuit 63, as shown in FIG. 2B, includes L drivers 680. Each of the drivers 680 is activated when the output YR[k] of a corresponding address comparing circuit AC[k] has the high level. Thus, a corresponding spare bit line SB[k] is connected to input/output lines I/O through MOS transistors 690 and 691, in response to a bit line selection signal $\Phi_Y$ and the output of a NOR gate 501 is set at a low level thereby disabling the Y-decoder 40. Accordingly, a regular bit line which is to be selected, is never selected. That is, the regular bit line is replaced by the spare bit line SB[k].

The present inventors have studied the above-mentioned redundancy technique and have found that the following problem occurs when increasing the level of integration of a semiconductor memory. That is, when the level of integration of a semiconductor memory is increased, a large number of memory cells are simultaneously replaced by spare memory cells through the redundancy technique, and thus a probability that a defective spare memory cell is used, is increased. This is because a large number of memory cells are arranged along a single word or bit line. For example, in a 256 Kbit memory ($N_W$=$N_B$=512), 512 memory cells are simultaneously replaced by spare memory cells. While, in a 16 Mbit memory ($N_W$=$N_B$=4,096), 4,096 memory cells are simultaneously replaced by spare memory cells. When at least one of the spare memory cells substituted for regular memory cells is defective, a chip having the spare and regular memory cells is faulty. The redundancy technique is used on the premise that spare memory cells are not defective. Accordingly, when the level or degree of integration of a semiconductor memory is increased, the manufacturing yields thereof cannot be improved by the redundancy technique.

In a case where a large-scale semiconductor memory is constructed in such a manner that a memory array is divided into a plurality of memory mats, the above problem becomes even more serious. When a semiconductor memory is made large in scale, the number of memory cells connected to a single word (or bit) line is increased, and wiring length is increased. Thus, the parasitic resistance and capacitance of a wiring conductor are increased. Hence, there arises a problem that a signal propagation time is increased and a signal-to-noise ratio is reduced. In order to solve this problem, a practice widely employed is to divide a memory array into a plurality of memory mats, thereby shortening the wiring length of a single word (or bit) line. However, when the redundancy technique is applied to a semiconductor memory which is divided into memory mats, the following problem is further aroused.

FIG. 3 shows an example of a semiconductor memory which corresponds to a case where the memory array of FIG. 1A is divided into four memory mats (that is, each word line is divided into two parts, and each bit line is divided into two parts). In FIG. 3, reference numerals 100 to 103 designate memory mats, 200 to 203 sense amplifiers and input/output lines, 300 and 301 X-decoders, 400 a Y-decoder, 610 and 611 spare word line selection circuits, 700 a multiplexer, 701 a data input buffer, and 702 an data output buffer. Each memory mat includes a region 110, 111, 112, or 113 where regular memory cells are arranged, and a region 120, 121, 122, or 123 where spare memory cells are arranged. In each of the regions 110, 111, 112 and 113 (which correspond to the sub-regions 11A, 11B, 11C and 11D of FIG. 1A, respectively), $N_W \times N_B/4$ memory cells are disposed at two-level crossings of $N_W/2$ word lines and $N_B/2$ bit lines. In each of the regions 120, 121, 122 and 123, $L \times N_B/2$ memory cells (in the figure, L=4) are disposed at two-level crossings of L spare word lines and the $N_B/2$ bit lines. For example, in a semiconductor memory described in the above-mentioned reference, $N_W/2$=64, $N_B/2$=128, and L=4.

Explanation will first be made of a word-line selecting method in the example of FIG. 3. In the present example, word lines are selected from a pair of memory mats. For example, at the same time as a word line W[i, 0] in the memory mat 110 is selected, a corresponding word line W[i, 2] in the memory mat 112 is selected. At this time, no word line in the memory mats 111 and 113 is selected. Similarly, when word lines in the memory mats 111 and 113 are selected, no word line in the memory mats 110 and 112 is selected. This is because the word lines W[i, 0] and W[i, 2] are made by dividing a single word line into two parts, and hence can be logically regarded as a single word line. Such is determined by one of the row address signals (in the present example, the address signal $A_X[n_W-1]$ indicative of the leftmost bit of a row address) as to which of a memory mat group 110 and 112 and a memory mat group 111 and 113 is to be selected. A memory cell is finally selected by using column address signals $A_Y[j]$ (where j=0, 1, . . . $n_B-1$). At this time, the multiplexer 700 determines which of a memory cell in the memory mat 110 or 111 and a memory cell in the memory mat 112 or 113 is to be selected, by using one of the column address signals (in this example, the address signal $A_Y[n_B-1]$ indicative of the leftmost bit of a column address).

In the present example, each address comparing circuit compares the row address signals other than the address signal $A_X[n_W-1]$ indicative of the leftmost bit, with the corresponding row address signals stored in the address comparing circuit. The outputs XR[k] of the address comparing circuits AC[k] are supplied to the spare word line selection circuit. The spare word line selection circuit, as shown in FIG. 4, makes the logical product of the row address signal $A_X[n_W-1]$ (or the complement thereof) and each of the outputs XR[k], to drive only a spare word line in the selected memory mat.

In the present memory, the replacement of a regular line by a spare line is made in all the memory mats at the same time. This fact will be explained below with reference to FIG. 5. FIG. 5 shows an example of a method of replacing word lines by spare word lines. In FIG. 5, defective word lines W[0, 0], W[2, 0], W[1, 1] and W[3, 3] are replaced by spare word lines SW[0, 0], SW[1, 0], SW[2, 1] and SW[3, 3], respectively. However, when the above replacement is carried out, other word lines are replaced by spare word lines. For example, at the same time as the defective word line W[0, 0] is replaced by the spare word line SW[0, 0], corresponding word lines W[0, 1], W[0, 2] and W[0, 3] in the memory mats 101, 102 and 103 are replaced by spare word lines SW[0,1], SW[0, 2] and SW[0, 3], respectively.

In the example of FIG. 3, there arises the following problems. The first problem is that, as is apparent from the comparison of FIG. 3 with FIG. 1A, an area necessary for spare word lines is increased by dividing a memory array into memory mats. This is because each memory mat includes L spare word lines. A sub-region 12A shown in FIG. 1A corresponds to the regions 120 and 121 of FIG. 3, and a sub-region 12B shown in FIG. 1A corresponds to the regions 122 and 123 of FIG. 3. Hence, in the present example, an area for spare word lines is twice as large as that in the example of FIG. 1A. When each word line is divided into $M_W$ parts and each bit line is divided into $M_B$ parts, an area for spare word lines is generally increased by a factor of $M_B$, and an area for spare bit lines is generally increased by a factor of $M_W$, though the spare bit lines are not shown in FIGS. 1A and 3. Thus, a chip area is increased.

The second problem is that when a defective word line is replaced by a spare word line, a large number of memory cells are replaced by spare memory cells. This is because, as mentioned above, the replacement of a word line by a spare word line is made in all the memory mats at the same time. When each word line is divided into $M_W$ parts and each bit line is divided into $M_B$ parts, the number of spare memory cells which are simultaneously substituted for regular memory cells at a time a defective word line is replaced by a spare word line, is generally increased by a factor of $M_B$, and the number of spare memory cells which are simultaneously substituted for regular memory cells at a time a defective bit line is replaced by a spare bit line, is generally increased by a factor of $M_W$. As has been already mentioned, an increase in the number of spare memory cells simultaneously substituted for regular memory cells reduces the manufacturing yields. The first and second problems become serious in a large-scale integration memory, in which each of $M_W$ and $M_B$ has a large value. FIG. 6 shows another method of applying the redundancy technique to a semiconductor memory, in which a memory array is divided into a plurality of memory mats. In FIG. 6, address comparing circuits are provided on a one-to-one basis for each of the spare word lines in the memory mats. Accordingly, 4L address comparing circuits (in the figure, eight address comparing circuits) are used. Each address comparing circuit compares row address signals $A_x[0]$ to $A_x[n_W-1]$ and column address signal $A_y[n_B-1]$ indicative of the leftmost bit, with those stored in the circuit.

FIG. 7 shows how defective word lines are replaced by spare word lines, by way of example. As is apparent from the comparison of FIG. 7 with FIG. 5, the method shown in FIG. 6 is superior in two points to the method shown in FIG. 3. The first point is that the utilization efficiency of a spare word line is high, and thus the same number of defective word lines as in the example of FIG. 3 can be replaced by spare word lines even when the number of spare word lines per one memory mat is made smaller than that in the example of FIG. 3. This is because the probability that many defective word lines are included in one memory mat, is very low. The second point is that the number of spare memory cells which are simultaneously substituted for regular memory cells is small.

In the method shown in FIG. 6, however, there arises a problem that the number of address comparing circuits is increased. When each word line is divided into $M_W$ parts and each bit line is divided into $M_B$ parts, $M_W M_B L$ address comparing circuits are generally required, and thus a chip area is increased. This problem is very serious in a large-scale integration memory, in which each of $M_W$ and $M_B$ has a large value.

According to the present invention, when a memory array is divided into M memory mats (where $M \geq 2$), the number m of word or bit lines which are simultaneously replaced by spare lines in accordance with the redundancy technique, is made smaller than the number M and equal to a divisor of the number M.

Further, an address comparing circuit can store therein not only logical values "0" and "1" but also a don't-care value "X". When input data is compared with the don't-care value, the result of comparison indicates "coincidence", independently of which of the logical values "1" and "0" is indicated by the input data. FIG. 8 shows the results of comparison made by the address comparing circuit.

By making the number m smaller than the number M, the number of memory cells which are simultaneously replaced by spare memory cells, is decreased. Thus, the probability that the spare word lines are defective, is reduced. Accordingly, a redundancy control circuit capable of greatly improving the manufacturing yields can be formed even in a large-scale integration memory.

When the address comparing circuit is so constructed as to be capable of storing the don't-care value "X", each bit of an applied address can be selectively compared with a stored value. As shown in FIG. 8, when a logical value "0" or "1" is stored in the address comparing circuit, the result of comparison indicates "coincident" or "not coincident" in accordance with input data. That is, the stored value is compared with a corresponding bit of an input address. When the don't-care value "X" is stored in the address comparing circuit, the result of comparison indicates "coincident", independently of input data. That is, that bit of an input address which corresponds to the stored value, is not compared therewith. Thus, for example, the following defect-repairing operations can be performed.

When all the bits of an address (that is, all the bits of row and column addresses) are compared with stored values, each of regular memory cells can be replaced by a spare memory cell. When only a column address is compared with a stored column address, each bit line can be replaced by a spare bit line. When bits of a column address other than the rightmost bit are compared with stored values, a pair of memory cells can be replaced by a pair of spare memory cells. That is, various defects in a semiconductor memory such as a single-bit defect, a bit-line defect and a pair-bit defect, can be repaired. Thus, the manufacturing yields of a semiconductor memory can be made higher than that due to the conventional redundancy technique.

It is an object of the present invention to provide a redundancy technique which can greatly improve the manufacturing yields of a semiconductor memory without requiring a large chip area.

It is another object of the present invention to provide a redundancy technique which can enhance the utilization efficiency of spare bits.

These and other objects and many of the attendant advantages of the present invention will be readily appreciated and become better understood by reference to the following detailed description when considered in connection with the accompanying drawings.

BRIEF DESCRIPTION OF THE DRAWINGS

FIGS. 1A to 8 are diagrams for explaining redundancy control circuits which were studied by the present inventors, and the points of issue of these circuits.

FIGS. 21 and 22 are diagrams for explaining the sixth embodiment of the present invention.

FIGS. 23, 24A, 24B and 25 are diagrams for explaining the seventh embodiment of the present invention.

FIGS. 26 and 27 are diagrams for explaining the eighth embodiment of the present invention.

FIGS. 28 and 29 are diagrams for explaining the ninth embodiment of the present invention.

DESCRIPTION OF THE PREFERRED EMBODIMENTS

Now, embodiments of the present invention will be explained below, with reference to the drawings. Although explanation will be made of a case where a redundancy technique is applied to a dynamic random access memory (DRAM), especially, a DRAM which includes memory cells each made up of a single transistor and a single capacitor, the present invention is also applicable to other semiconductor memories such as a static random access memory (SRAM), an erasable programmable read only memory (EPROM), and an electrically erasable programmable read only memory (EEPROM). Further, although a semiconductor memory utilizing CMOS techniques will mainly be explained, the present invention is also applicable to a semiconductor memory made up of MOS transistors of the same polarity, bipolar transistors, or the combination of these transistors. Further, the combination of a semiconductor memory according to the present invention and a microcomputer can produce a remarkable effect, and it is preferable to form the semiconductor memory and the microcomputer on a single chip.

Embodiment 1

Figure 1A:
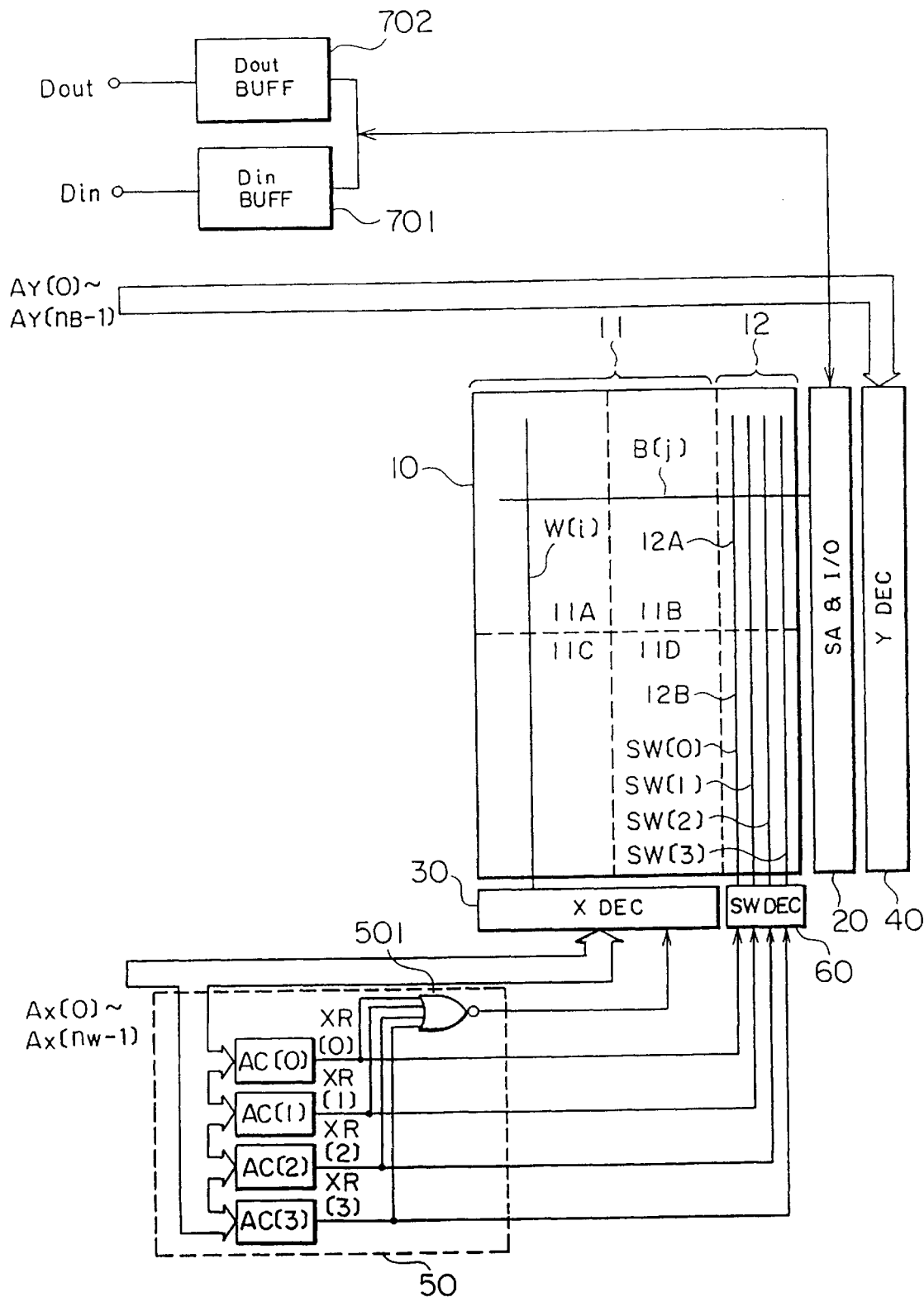
Figure 1B:
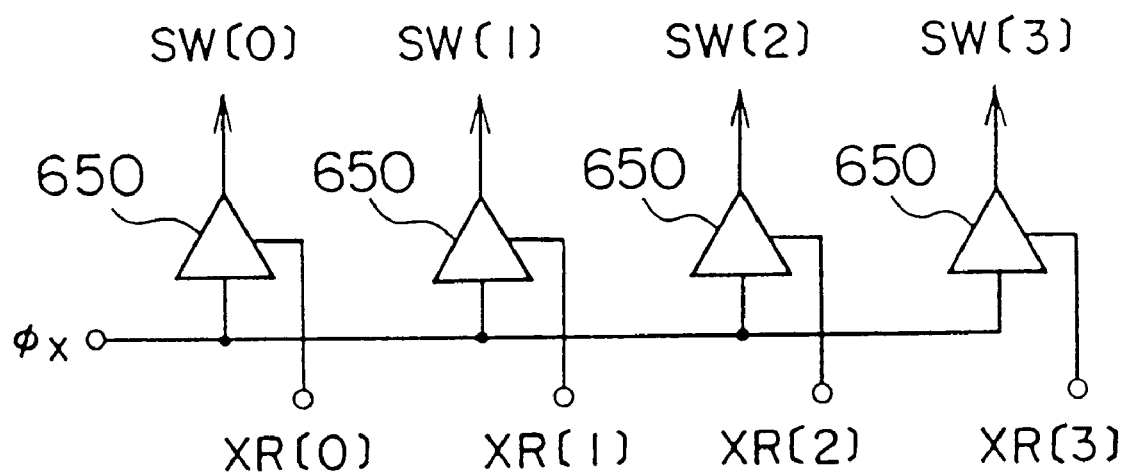
Figure 9:
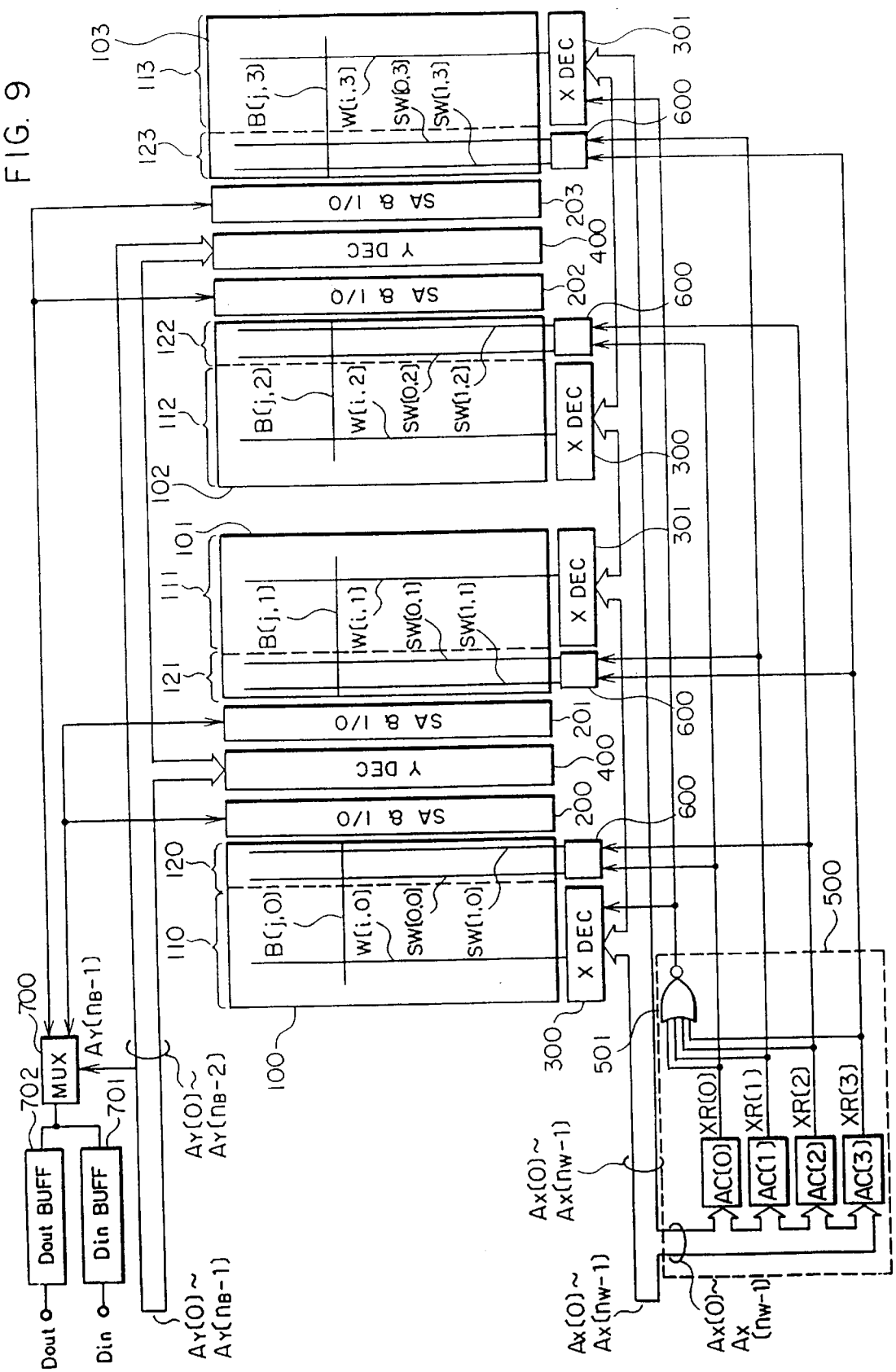
FIGS. 9 and 10 are diagrams for explaining the first embodiment of the present invention.

FIG. 9 shows the first embodiment of a semiconductor memory according to the present invention. In FIG. 9, reference numerals 100 to 103 designate memory mats, 200 to 203 sense amplifiers and input/output lines, 300 and 301 X-decoders, 400 a Y-decoder, 500 a redundancy control circuit, 600 a spare word line selection circuit (having the same circuit configuration as shown in FIG. 1B), 700 a multiplexer, 701 a data input buffer, and 702 a data output buffer. Each of the memory mats includes a region 110, 111, 112, or 113 where regular memory cells are arranged, and a region 120, 121, 122, or 123 where spare memory cells are arranged. In each of the regions 110 to 113, $N_W \times N_B/4$ memory cells are disposed at the two-level crossings of $N_W/2$ word lines W[i, n] (where i=0, 1, ... $N_W/2-1$, and n=0, 1, ... 3) and $N_B/2$ bit lines B[j, n] (where j=0, 1, ... $N_B/2-1$, and n=0, 1, ... 3). In each of the regions 120 to 123, $L \times N_B/2$ memory cells (in the figure, L=2) are disposed at the two-level crossings of L spare word lines SW[k, n] (where k=0, ... L-1 and n=0, 1, ... 3) and $N_B/2$ bit lines. Although the memory array of the present embodiment has the folded bit line structure, the present invention is also applicable to a semiconductor memory having the open bit line structure. In a case where the folded bit line structure is used, a bit line is formed of two wiring conductors. However, only one wiring conductor is shown in the drawings for the sake of simplicity. Details of the folded bit line structure and open bit line structure are described on pages 127 to 135 of the IEE PROC., Vol. 130, No. 3, June, 1983.

Now, explanation will be made of a redundancy technique which is carried out for a defective word line in the present embodiment. A word line selection method will first be explained. In the present embodiment, word lines in two memory mats are simultaneously selected. For example, in a case where a word line W[i, 0] in the memory mat 110 is selected, a corresponding word line W[i, 2] in the memory mat 112 is selected at the same time as the word line W[i, 0] is selected. At this time, no word line in the memory mats 111 and 113 is selected. Similarly, when word lines in the memory mats 111 and 113 are selected, no word line in the memory mats 110 and 112 is selected. This is because the word lines W[i, 0] and W[i, 2] are made by dividing a single word line into two parts, and hence can be logically regarded as a single word line. It is determined by one of row address signals (for example, the address signal $A_x[n_W-1]$ indicative of the leftmost bit of a row address) which of a memory mat group 110 and 112 and a memory mat group 111 and 113 is to be selected. A memory cell is finally selected by using column address signals $A_Y[j]$ (where j=0, 1, ... $n_B-1$). At this time, the multiplexer 700 determines which of a memory cell in the memory mat 110 or 111 and a memory cell in the memory mat 112 or 113 is to be selected, by using one of the column address signals (for example, the address signal $A_Y[n_B-1]$ indicative of the leftmost bit of a column address).

Figure 3:
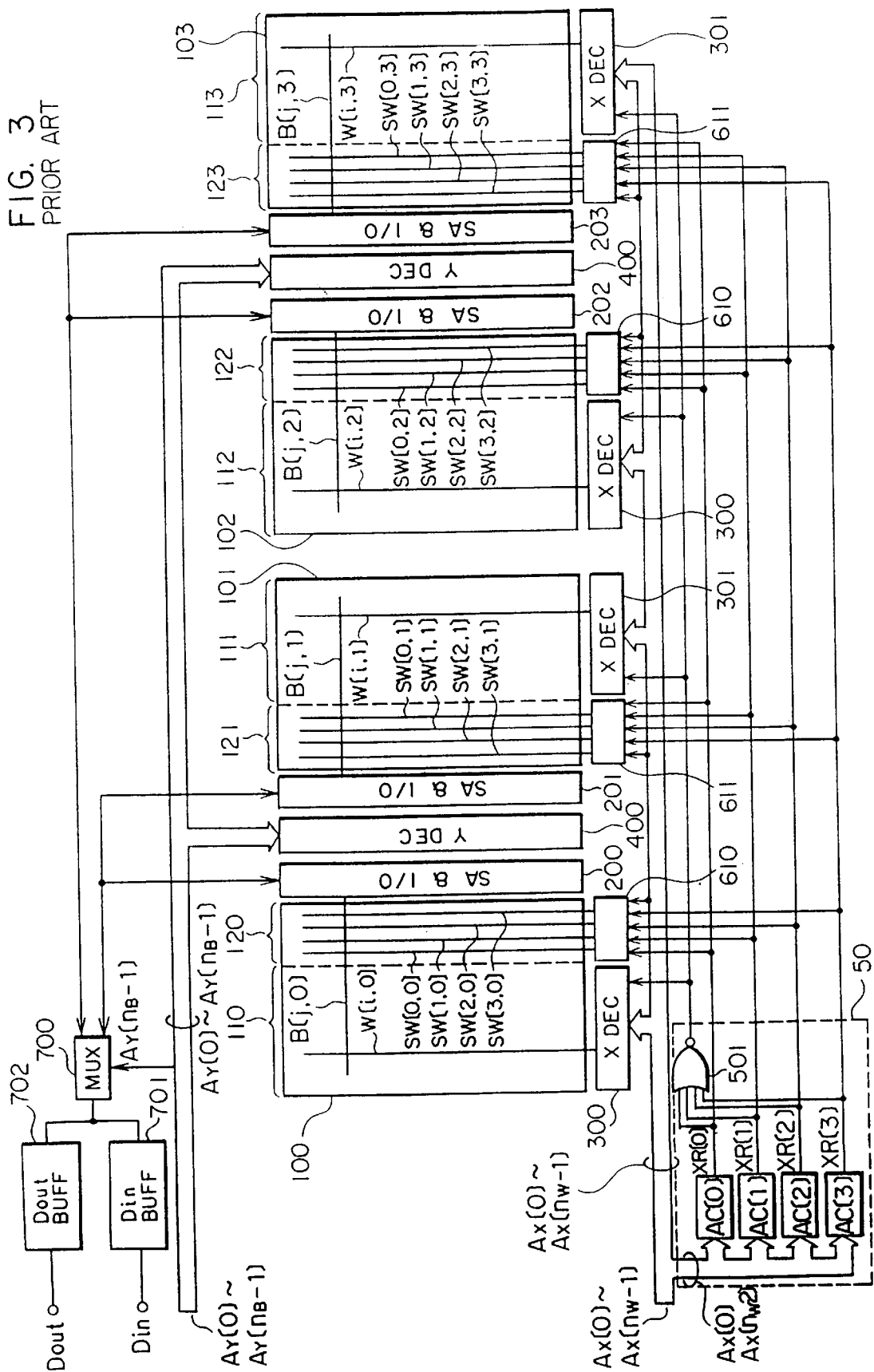
Figure 4:
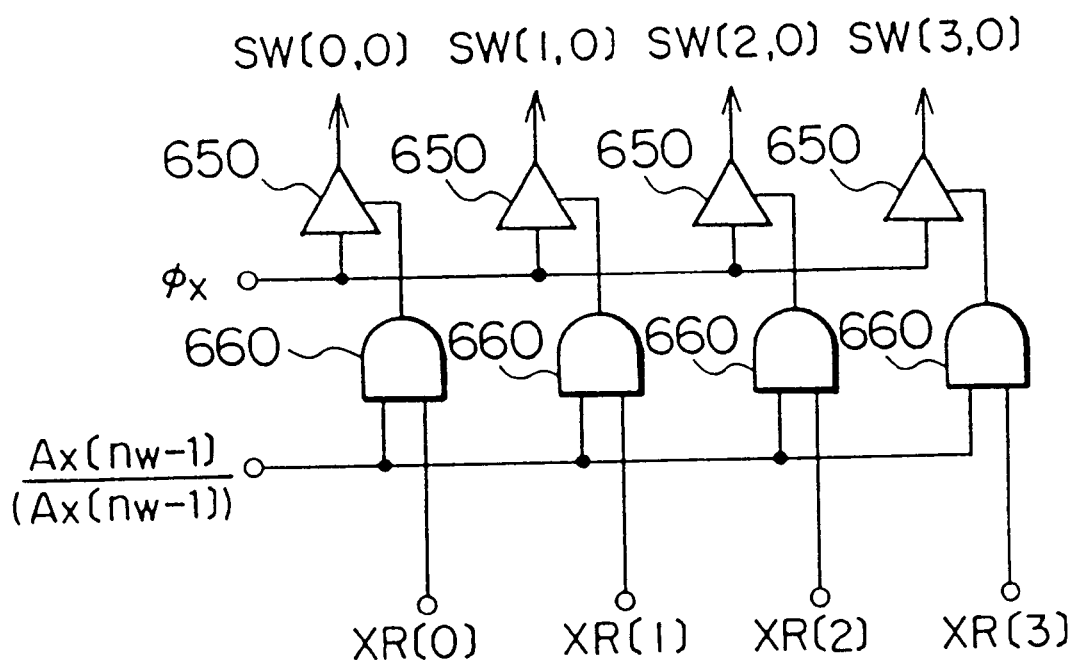
Figure 5:
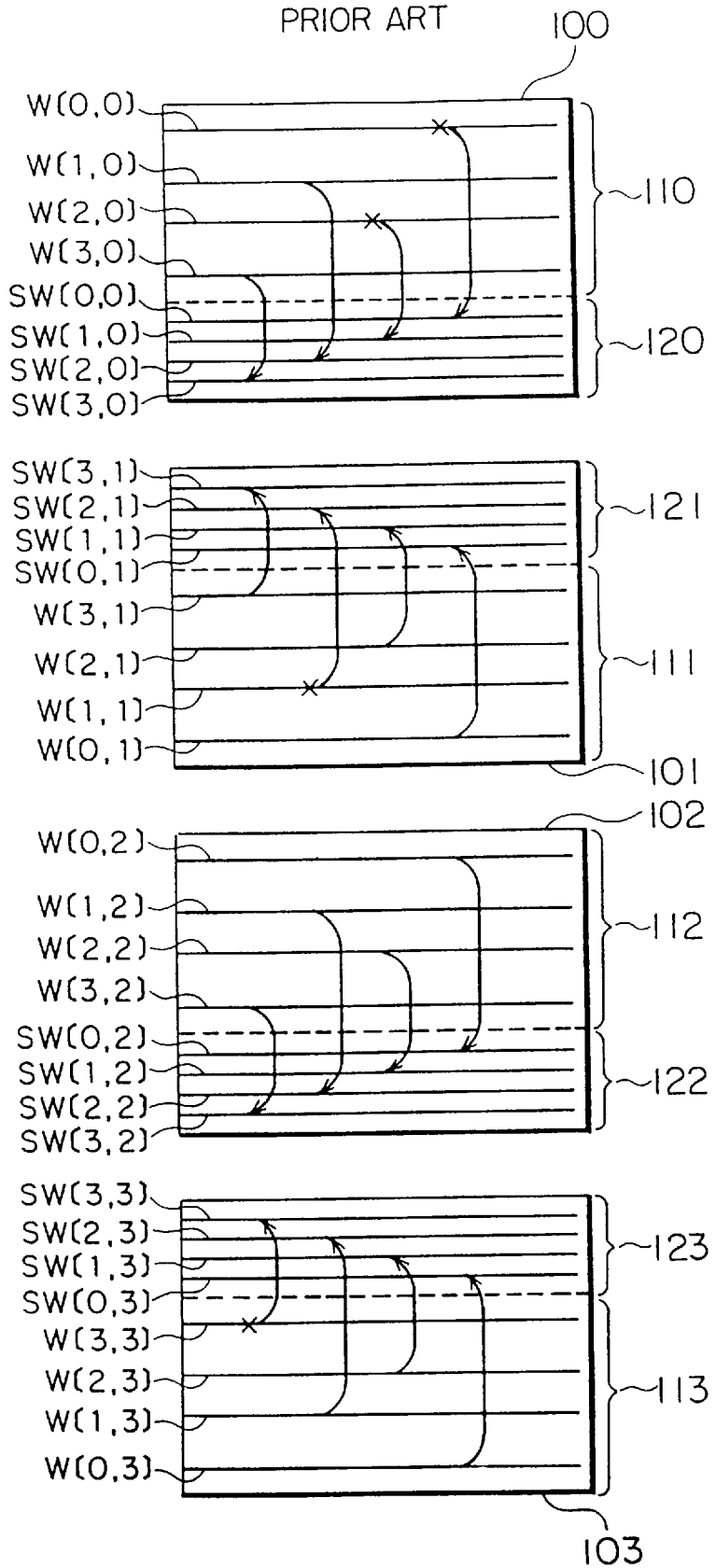
Figure 10:
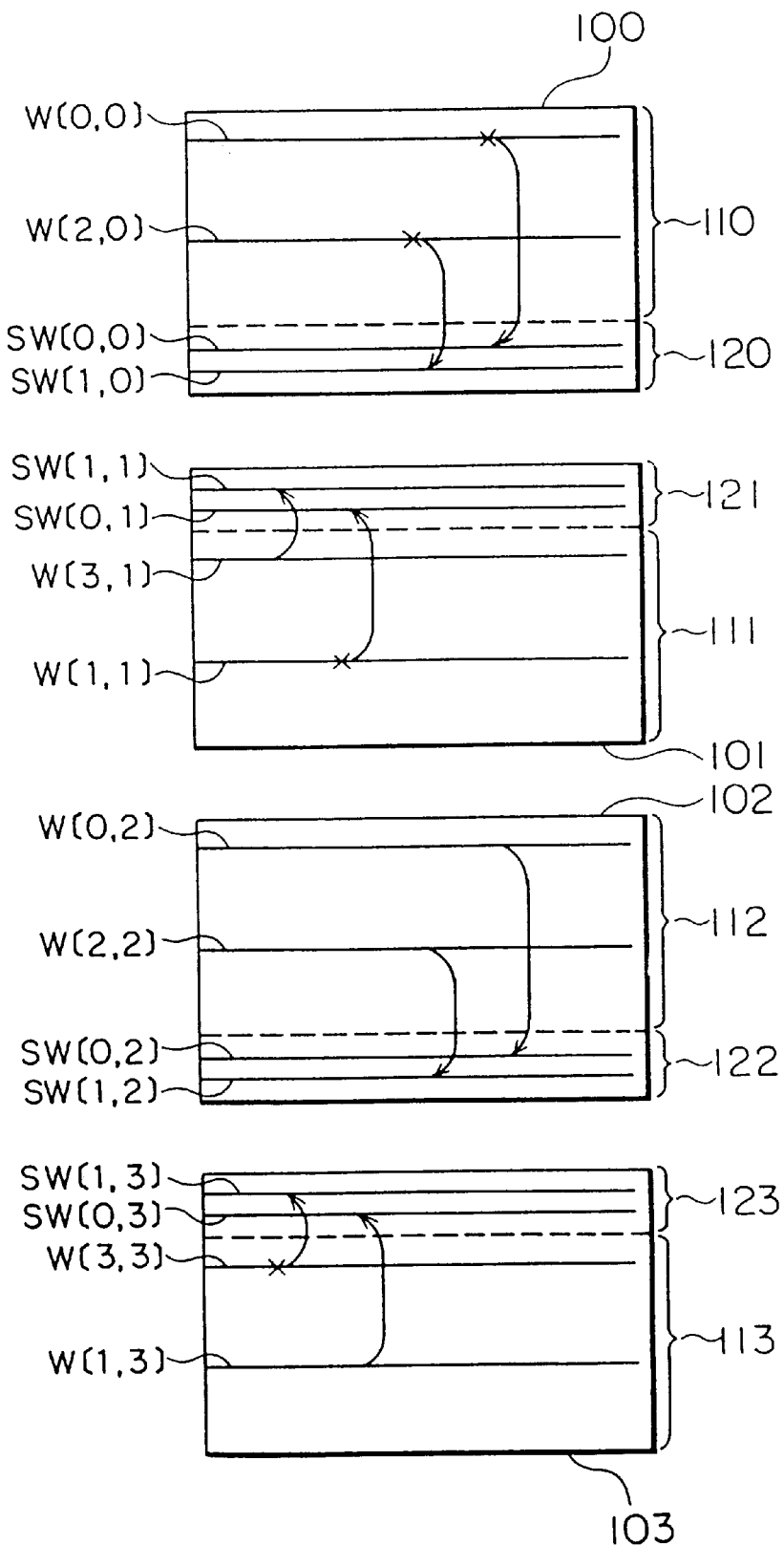

Next, a method of replacing a defective word line by a spare word line will be explained. In the memory of FIG. 3, as shown in FIG. 5, regular word lines in four memory mats are simultaneously replaced by spare word lines. For example, in a case where the word line W[0, 0] in the memory mat 110 is defective, corresponding word lines W[0, 1], W[0, 2] and W[0, 3] in other memory mats are replaced by spare word lines at the same time as the word line W[0, 0] is replaced by a spare word line. In the present embodiment, however, word lines in two memory mats which are simultaneously selected are simultaneously replaced by spare word lines. FIG. 10 shows how word lines are replaced by spare word lines. For example, in a case where the word line W[0, 0] in the memory mat 110 is defective, word lines W[0, 0] and W[0, 2] are simultaneously replaced by spare word lines, but no word line in the memory mats 111 and 113 is replaced by a spare word line.

In order to realize the above replacement method, each address comparing circuit compares the row address signal $A_x[n_W-1]$ indicative of the leftmost bit of a row address with a stored value. As has been already mentioned, the row address signal $A_x[n_W-1]$ is used for selecting one of the memory mat group 110 and 112 and the memory mat group 111 and 113. In the memory of FIG. 3, word lines in four memory mats are simultaneously replaced by spare word lines, and hence each address comparing circuit does not compare the address signal $A_x[n_W-1]$ with stored data. In the present embodiment, however, the row address signal $A_x[n_W-1]$ is compared with the stored data, to realize the above-mentioned replacement method.

The first advantage of the present embodiment is that, since the above replacement method is used, the number of memory cells which are simultaneously replaced by spare memory cells, is reduced. In the memory of FIG. 3, $N_B/2 \times 4$ (=$2N_B$) memory cells are simultaneously replaced by spare memory cells while in the present embodiment, $N_B/2 \times 2$ (=$N_B$) memory cells are simultaneously replaced by spare memory cells. That is, the number of memory cells which are simultaneously replaced by spare memory cells is one-half that in the memory of FIG. 3. Thus, the probability that a defective memory cell is included in the spare memory cells substituted for regular memory cells is reduced, and the manufacturing yields of a semiconductor memory are improved. This effect is not remarkable in the present embodiment, since the memory array is divided into a relatively small number of memory mats. In a large-scale integration memory where a memory array is divided into a large number of memory mats, however, the above effect becomes remarkable. This is because the probability that none of the spare memory cells is defective is inversely proportional to an exponential function having the number of spare memory cells as the power.

Now, let us consider a memory where each word line is divided into $M_W$ parts and each bit line is divided into $M_B$ parts. In a case where corresponding regular word lines in all memory mats are simultaneously replaced by spare word lines, $N_B M_B$ memory cells are simultaneously replaced by spare memory cells. On the other hand, in a case where corresponding regular word lines in m memory mats (where m is a divisor of a numerical value $M_W M_B$ ) are simultaneously replaced by spare word lines in accordance with the present invention, $mN_B/M_W$ memory cells are simultaneously replaced by spare memory cells. That is, the number of memory cells which are simultaneously replaced by spare memory cells, is reduced by a factor of $m/M_W M_B$, as compared with that in the former case. It is to be noted that, in the present embodiment of FIG. 9, $M_W$=2, $M_B$ =2, and m=2. For example, let us consider a 16 Mbit memory where $N_W$=$N_B$=4,096, $M_W$=4, $M_B$=16, and m=8. In a case where corresponding regular word lines in all memory mats are simultaneously replaced by spare word lines, 65,536 memory cells are simultaneously replaced by spare memory cells. However, in a case where corresponding regular word lines in m memory mats are simultaneously replaced by spare word lines in accordance with the present invention, 8,192 memory cells which is one-eighth of 65,536 memory cells, are simultaneously replaced by spare memory cells, and thus the probability that a defective memory cell is included in the spare memory cells, is greatly reduced.

The second advantage of the present embodiment is that each spare word line has high utilization efficiency. Let us consider a case where the word line W[$i_1$, 0] in the memory mat 110 and the word line W[$i_2$, 1] in the memory mat 111 are defective (where $i_1 \ne i_2$), by way of example. In the memory of FIG. 3, in order to repair such defects, two spare word lines are used in each memory mat. That is, word lines W[$i_1$, 0] to W[$i_1$, 3] are replaced with spare word lines SW[0, 0] to SW[0, 3), respectively, and word lines W[$i_2$, 0] to W[$i_2$, 3] are replaced by spare word lines SW[1, 0] to SW[1, 3], respectively. In the present embodiment, however, only one spare word line is used in each memory mat to repair the above defects, that is, only four spare word lines are used. In other words, word lines W[$i_1$, 0] and W[$i_1$, 2] are replaced by spare word lines SW[0, 0] and SW[0, 2], respectively, and word lines W[$i_2$, 1] and W[$i_2$, 3] are replaced by spare word lines SW[0, 1] and SW[0, 3], respectively. Thus, the spare word lines SW[1, 0] to SW[1, 3] can be used for repairing other defects, and hence the manufacturing yields of a memory can be improved.

A further advantage of the present embodiment is that the degree of freedom in selecting the number L of spare word lines included in one memory mat and the number R of address comparing circuits is large. In the conventional method shown in FIG. 3, corresponding regular word lines in all the memory mats are simultaneously replaced by spare word lines, and hence it is required to satisfy a relation L=R. For example, in FIG. 3, L=R=4. While, according to the present invention, the number L and the number R can be relatively freely selected, and hence a redundancy control circuit can be formed which is small in area and high in operation efficiency. Next, the relation between the number L and the number R will be explained.

In a case where corresponding regular lines in m memory mats are simultaneously replaced by spare lines, the following relation is generally satisfied:

$$L \leq R \leq LM_W M_B/m \qquad (1)$$

The inequality sign on the left side indicates that it is nonsense to make the number of spare lines included in one memory mat greater than the number of address comparing circuits. The inequality sign on the right side has the following meaning. Each memory mat includes L spare lines, and the number of memory mats is $M_W M_B$. Accordingly, $LM_W M_B$ spare lines are provided in a physical sense. However, m spare lines are simultaneously substituted for regular lines. Accordingly, $LM_W M_B/m$ spare lines exist in a logical sense. The inequality sign on the right side in the formula (1) indicates that it is nonsense to make the number of address comparing circuits greater than the number of logical spare lines. In the conventional method shown in FIG. 3, the number m is equal to $M_W M_B$, and hence it is required to make the number L equal to the number R. According to the present invention, however, the number L and the number R can be freely selected, provided that the formula (1) is satisfied.

When viewed from the standpoint of chip area, it is preferable to increase the number R rather than the number L. This is because an area for one address comparing circuit is generally smaller than an area necessary for providing one spare line in each memory mat. In the conventional method, it is required to satisfy the relation L=R, and hence it is impossible to increase only the number R. According to the present invention, only the number R can be increased. Accordingly, it is possible to make the number L relatively small and to make the number R relatively large. Thus, a redundancy control circuit can be formed which is small in area and high in operation efficiency. In other words, the gist of the present invention is to satisfy a relation which is obtained by eliminating the equality sign on the left side from the formula (1), that is, the following relation:

$$L < R \leq LM_W M_B/m \qquad (2)$$

For example, in the present embodiment of FIG. 9, $M_W$=$M_B$=2, and m=2. Accordingly, the formula (2) is rewritten as follows:

$$L < R \leq 2L$$

It is to be noted that, in the present embodiment, L=2 and R=4.

When the number R is made greater than the number L, it may become impossible to replace defective lines by spare lines, in spite of a fact that the number of defective lines is less than the number R. For example, in a case where defective lines are concentrated in a memory mat, and the number of defective lines included in the memory mat is less than the number R but is greater than the number L, the above problem is realized. In this case, a sufficient number of address comparing circuits exist, but the faulty memory mat is deficient in physical spare lines, and hence it is impossible to replace the defective lines by spare lines. However, the probability that a large number of defective lines are concentrated in one memory mat is very small. Accordingly, when the number L is made greater than or equal to two (2), the above problem is scarcely realized.

The present embodiment is applicable not only to a memory employing the address multiplex system but also to a memory which does not employ the address multiplex system.

Embodiment 2

Figure 11:
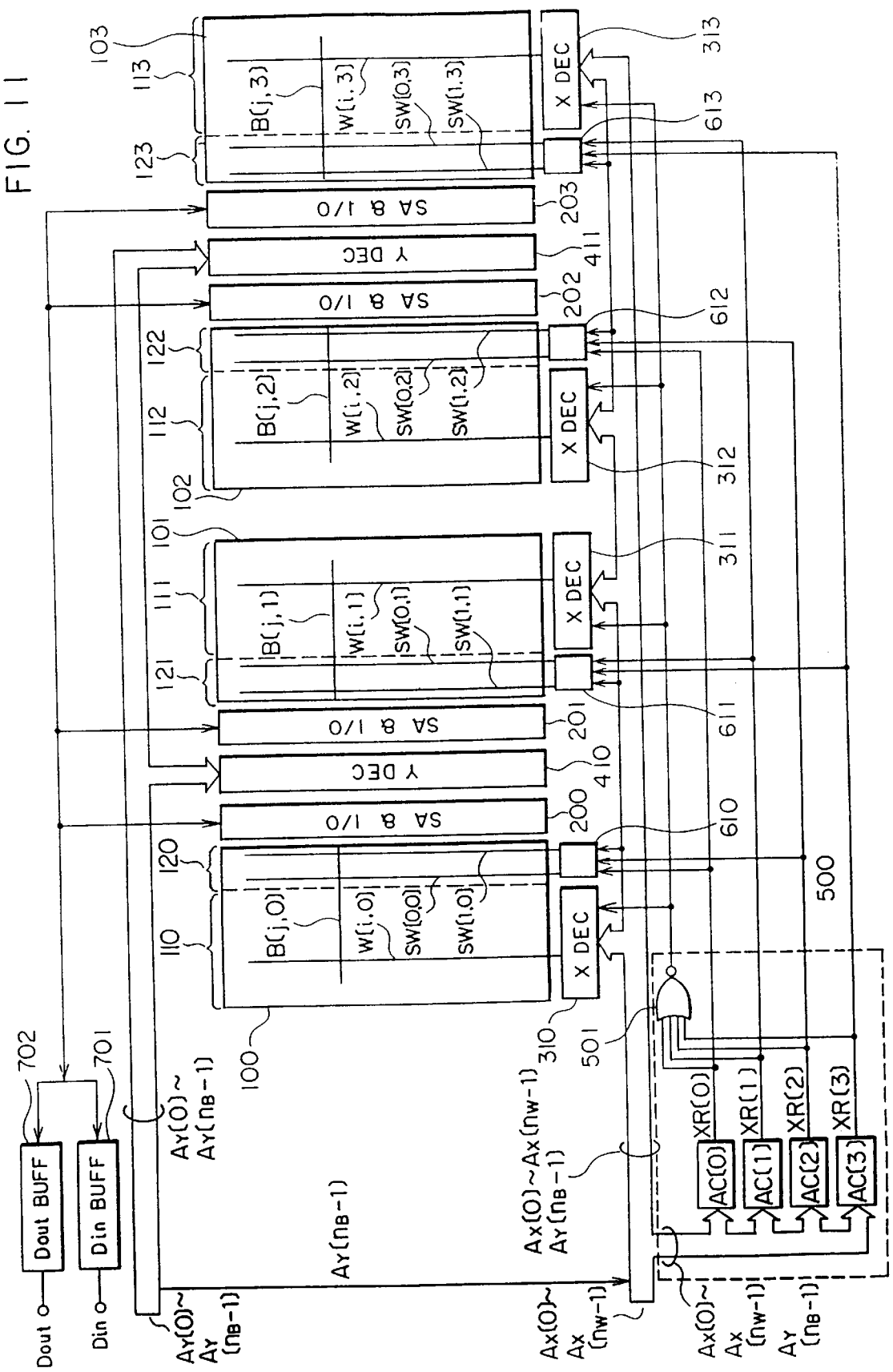
FIGS. 11 to 13 are diagrams for explaining the second embodiment of the present invention.

As is evident from the above explanation, it is desirable to make the number m of word lines which are simultaneously replaced by spare word lines, through the redundancy technique, as small as possible. FIG. 11 shows the second embodiment of a semiconductor memory according to the present invention, in which embodiment the number m is made equal to one (1). The present embodiment is different from the first embodiment of FIG. 9 in the word line selection method and the defective word line replacement method. In the embodiment of FIG. 9, corresponding regular word lines in two memory mats are simultaneously selected, and are simultaneously replaced by spare word lines. In the present embodiment, however, only a word line in one memory mat is selected and replaced by a spare word line.

Figure 12:
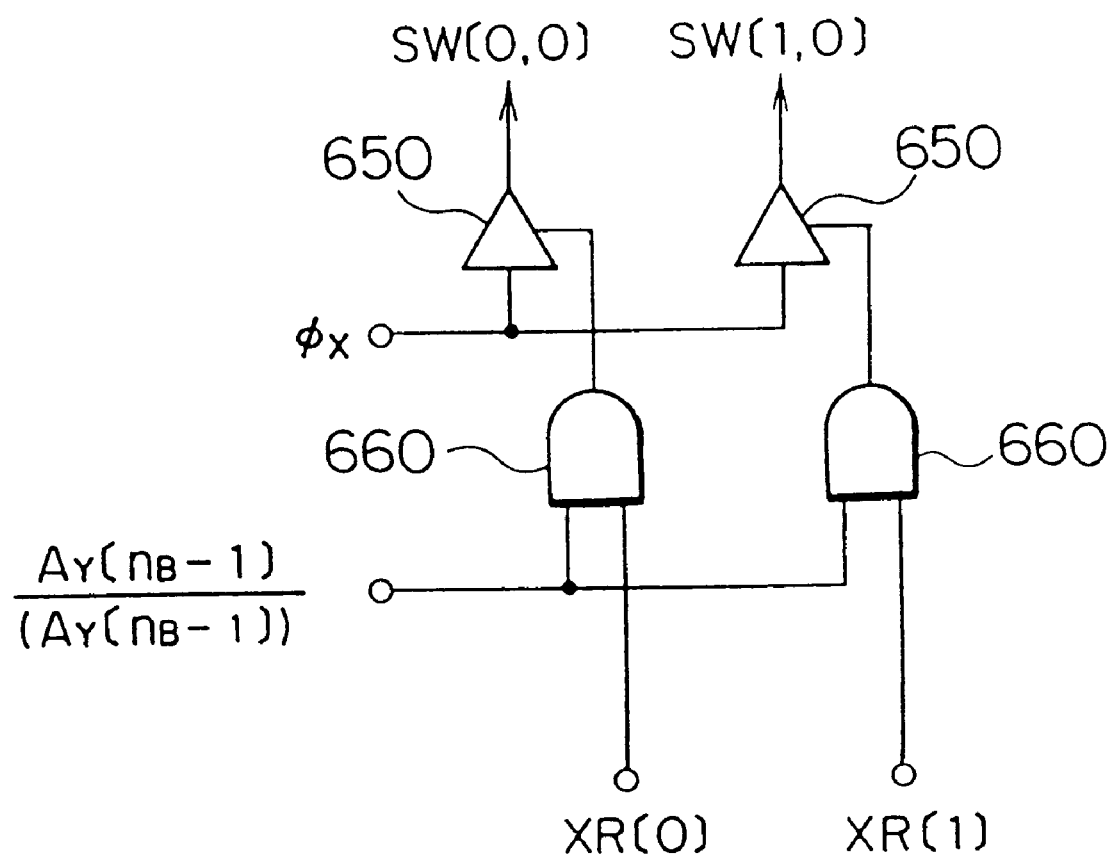

In the present embodiment, the column address signal $A_Y[n_B-1]$ is used for realizing the above selection/replacement operation. As has been already mentioned, the address signal $A_Y[n_B-1]$ is used for discriminating between the memory mats 110 and 112, and for discriminating between the memory mats 111 and 113. First of all, not only the row address signals but also the column address signal $A_Y[n_B-1]$ is applied to the X-decoders, to select only one memory mat from four memory mats. Next, not only the row address signals but also the column address signal $A_Y[n_B-1]$ is compared with stored data in each address comparing circuit, to replace a regular word line in one memory mat by a spare word line. In order to perform such an operation, each of the spare word line selection circuits 610 to 613 has the circuit configuration shown in FIG. 12. Referring to FIG. 12, the logical product of the output XR[k] of an address comparing circuit and the column address signal $A_Y(n_B-1]$ (or the complement thereof) is produced, to drive only a spare word line in the selected memory mat.

As shown in the above, it is a feature of the present embodiment to use a column address in replacing a defective word line by a spare word line. In the conventional redundancy technique, only a row address is used for replacing a defective word line by a spare word line, and only a column address is used for replacing a defective bit line by a spare bit line. When a column address is used for replacing a defective word line by a spare word line in a memory including a plurality of memory mats, and a row address is used for replacing a defective bit line by a spare bit line in the memory, the following effects are produced.

Figure 13:
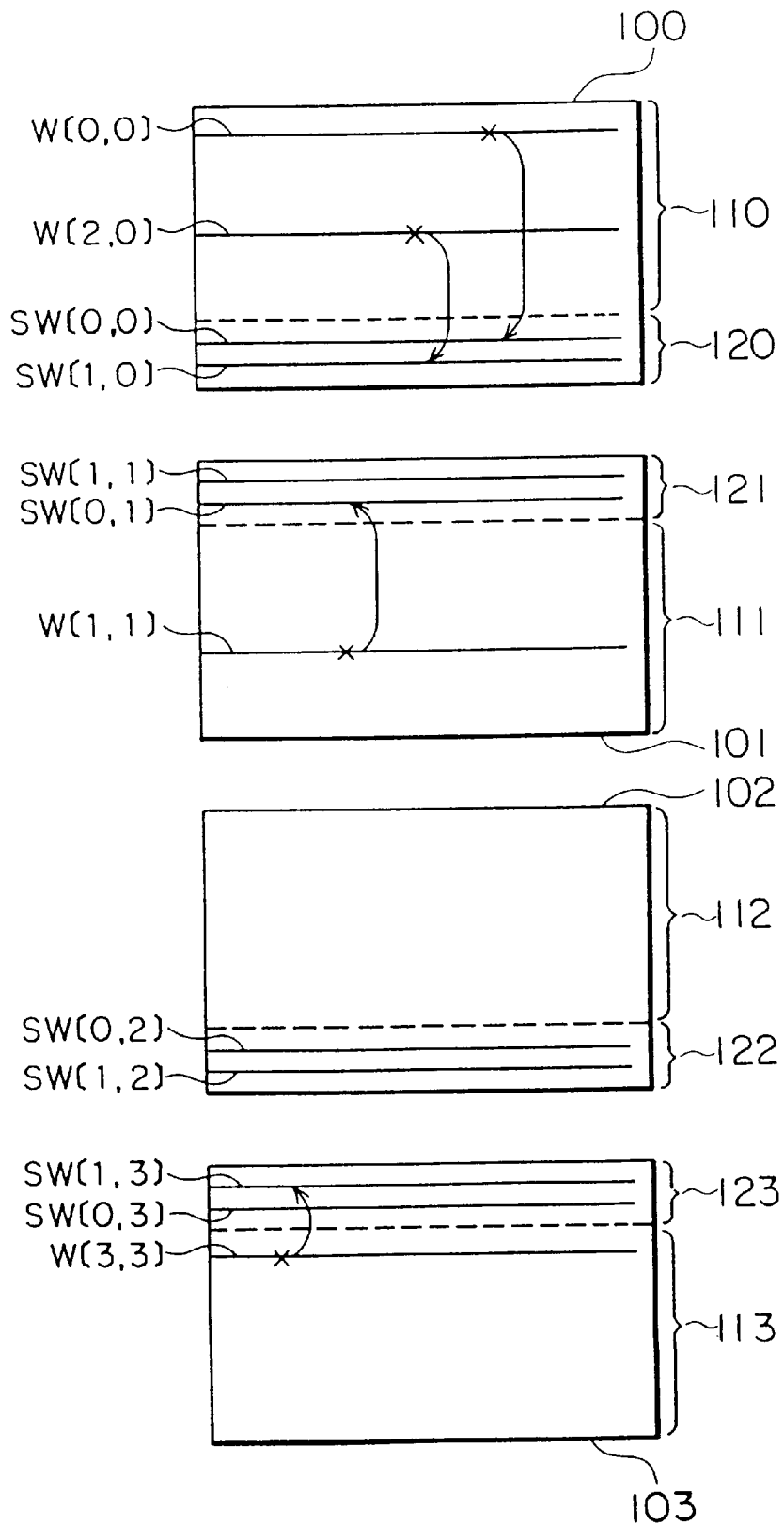

FIG. 13 shows how defective word lines are replaced by spare word lines in the present embodiment, by way of example. As mentioned above, the number m of word lines which are simultaneously replaced by spare word lines is equal to one (1). Hence, the number of memory cells which are simultaneously replaced by spare memory cells, is one-half that in the embodiment of FIG. 9. Accordingly, the probability that the spare memory cells include a defective memory cell, is further reduced, and thus the manufacturing yields of a semiconductor memory is further improved.

Further, since the number of word lines which are simultaneously replaced by spare word lines, is reduced, the utilization efficiency of spare word lines is higher than that in the embodiment of FIG. 9. For example, let us consider a case where word lines $W[i_1,0]$ and $W[i_2, 0]$ (where $i_1 \neq i_2$) are defective. In the embodiment of FIG. 9, four spare word lines are used for repairing the above defects. While, in the present embodiment, only two spare word lines are used.

Figure 6:
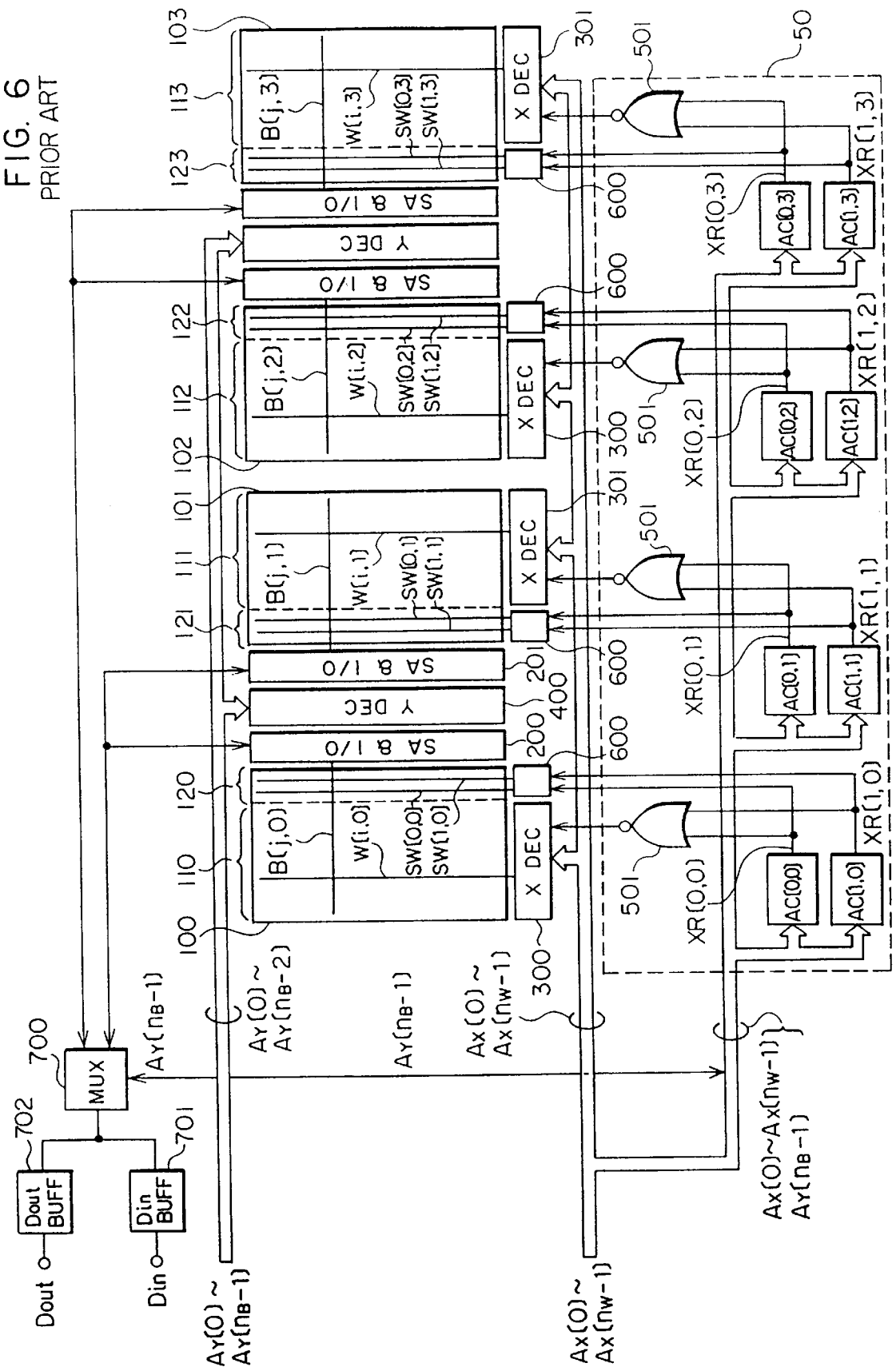
Figure 7:
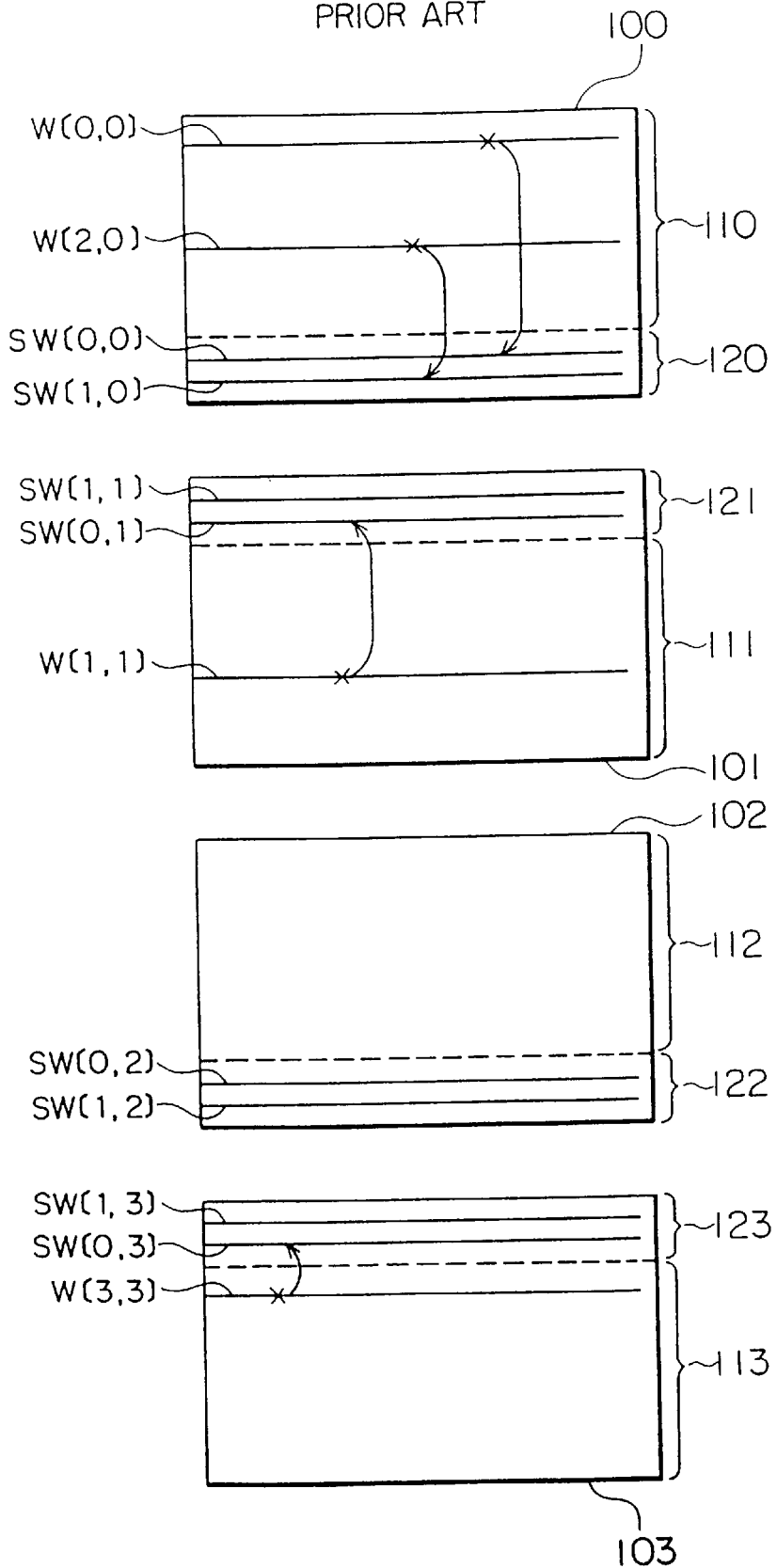

In the present embodiment, the number m of word lines which are simultaneously replaced by spare word lines, is smaller than that in the embodiment of FIG. 9. Accordingly, as can be seen from the formula (1), the degree of freedom in determining the number R of address comparing circuits is larger than that in the embodiment of FIG. 9. Therefore, an efficient redundancy control circuit can be formed in accordance with how defects are generated. This will be evident from the comparison of the present embodiment with the memory of FIG. 6. In the memory of FIG. 6, address comparing circuits are provided for all the spare word lines in all memory mats, and thus $R=LM_WM_B$. That is, the equality sign on the right side in the formula (1) is used. In the present embodiment, it is not always required to realize the equality sign on the right side. That is, in a case where a relatively small number of defective word lines exist, the number R of address comparing circuits can be made smaller than that in the memory of FIG. 6. Accordingly, the area for address comparing circuits can be reduced. In the present embodiment, m=1 and L=2. Accordingly, the formula (1) is rewritten as follows:

$$L=2 \leq R \leq 8 = LM_W M_B/m$$

The number R is actually equal to four (4).

Embodiment 3

Figure 14:
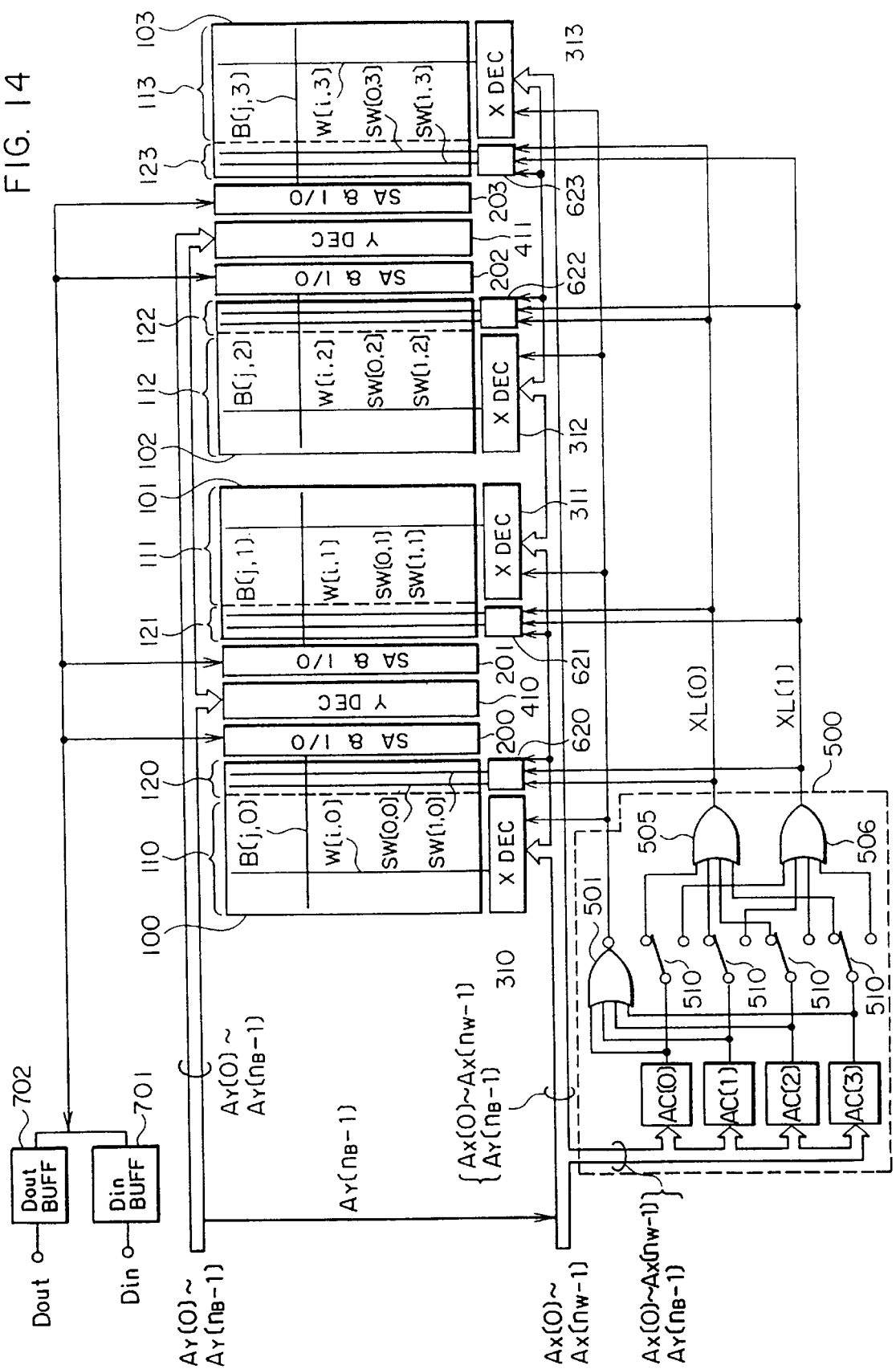
FIGS. 14 to 16 are diagrams for explaining the third embodiment of the present invention.
Figure 15:
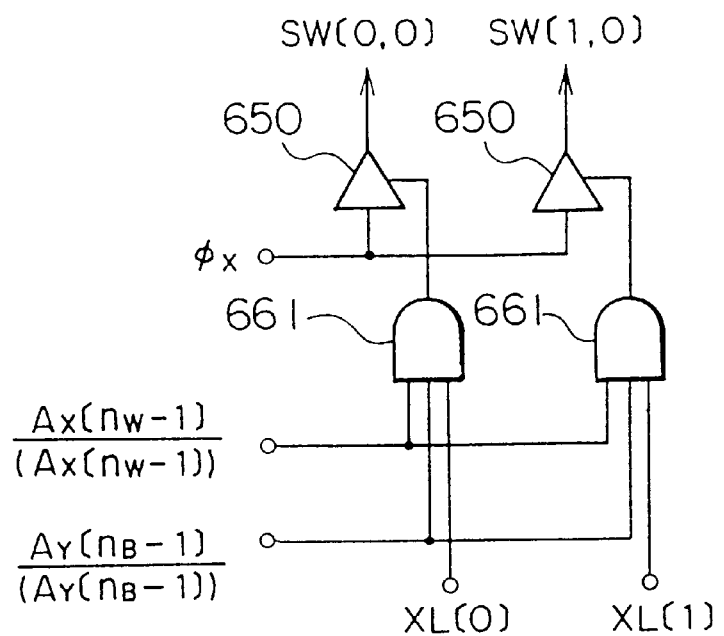

FIG. 14 shows the third embodiment of a semiconductor memory according to the present invention. In the present embodiment, an address comparing circuit is not directly connected to a spare word line selection circuit, but is connected thereto through a switching circuit 510 and an OR gate 505 or 506. In keeping with such circuit connection, each of address comparing circuits 620 to 623 has the circuit construction shown in FIG. 15. Referring to FIG. 15, the logical product of an output XL[k], the address signal $A_X[n_W-1]$ (or the complement thereof) and the address signal $A_Y[n_B-1]$ (or the complement thereof) is produced to drive only a spare word line in a selected memory mat. The address signals $A_X[n_W-1]$ and $A_Y[n_B-1]$ are used for specifying the memory mat. The present embodiment has the following features.

The first feature resides in that the number of wiring conductors for connecting the redundancy control circuit 500 to the spare word line selection circuits 620 to 623 can be reduced. In the embodiment of FIG. 11, R wiring conductors are used. While, in the present embodiment, L wiring conductors are used. As has been already mentioned, in the present invention, the number L is generally smaller than the number R. Accordingly, the number of wiring conductors in the present embodiment is smaller than that in the embodiment of FIG. 11.

The second feature of the present embodiment resides in that the electrical connection between the address comparing circuits and the spare word lines can be flexibly altered, and hence each address comparing circuit can be flexibly utilized. In the memories which have been already mentioned, the electrical connection between address comparing circuits and spare word lines is fixed. For example, in the memory of FIG. 3, an address comparing circuit AC[k] is used for driving only spare word lines SW[k, 0] to SW[k, 3] (where k=0, 1, 2, or 3). In the memory of FIG. 6, an address comparing circuit AC[k, l] is used for driving only a spare word line SW[k, l] (where k=0 or 1, and l=0, 1, 2 or 3). In the embodiment of FIG. 11, an address comparing circuit AC[2k] is used for driving only spare word lines SW[k, 0] and SW[k, 2], and an address comparing circuit AC[2k+1] is used for driving only spare word lines SW[k, 1] and SW[k, 3] (where k=0, or 1). In the present embodiment, such restrictions do not exist, and each address comparing circuit can drive a desired one of spare word lines, provided that the address stored in the address comparing circuit is changed, and the corresponding one of the switching circuits 510 is put in an appropriate connecting state. Two bits $A_X[n_W-1]$ and $A_Y[n_B-1]$ of the address stored in the address comparing circuit specify a memory mat, and one of the switching circuits 510 specifies a spare word line in the specified memory mat. Thus, the probability that defects can be repaired, is increased. Let us consider a case where two defective word lines exist in each of the memory mats 110 and 112, by way of example, the embodiment of FIG. 11 cannot repair such defects, but the present embodiment can repair the defects.

The third feature of the present embodiment is that the present embodiment is tolerant to the trouble in an address comparing circuit, since the electrical connection between address comparing circuits and spare word lines can be flexibly changed. For example, let us consider a case where the address comparing circuit AC[0] is used for driving the spare word line SW[0, 0]. When the address comparing circuit AC[0] is found defective, for example, the address comparing circuit AC[1] can be used in place of the circuit AC[0].

Needless to say, the present embodiment has the features of the embodiment of FIG. 11, in addition to the first, second and third features.

Figure 16:
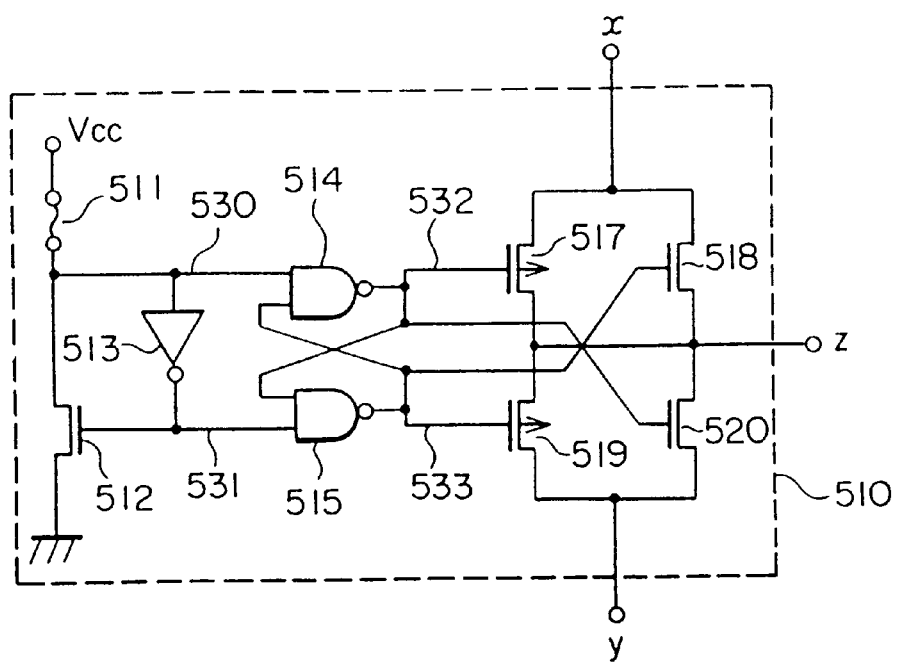

FIG. 16 shows an example of the switching circuit 510 included in the present embodiment. In FIG. 16, reference numeral 511 designates a fuse which can be blown by a laser beam, 512, 518 and 520 N-channel MOS transistors, 517 and 519 P-channel MOS transistors, 513 an inverter, and 514 and 515 NAND gates. When the fuse is not blown, a node 532 is kept at a low potential level, and a node 533 is kept at a high potential level. Thus, a signal can be transmitted between terminals x and z. When the fuse is blown, the node 532 is put to a high potential level, and the node 533 is put to a low potential level. Thus, a signal can be transmitted between terminals y and z.

The present embodiment is an improved version of the embodiment of FIG. 11. A similar improved version can be formed for the embodiment of FIG. 9.

Embodiment 4

Figure 17:
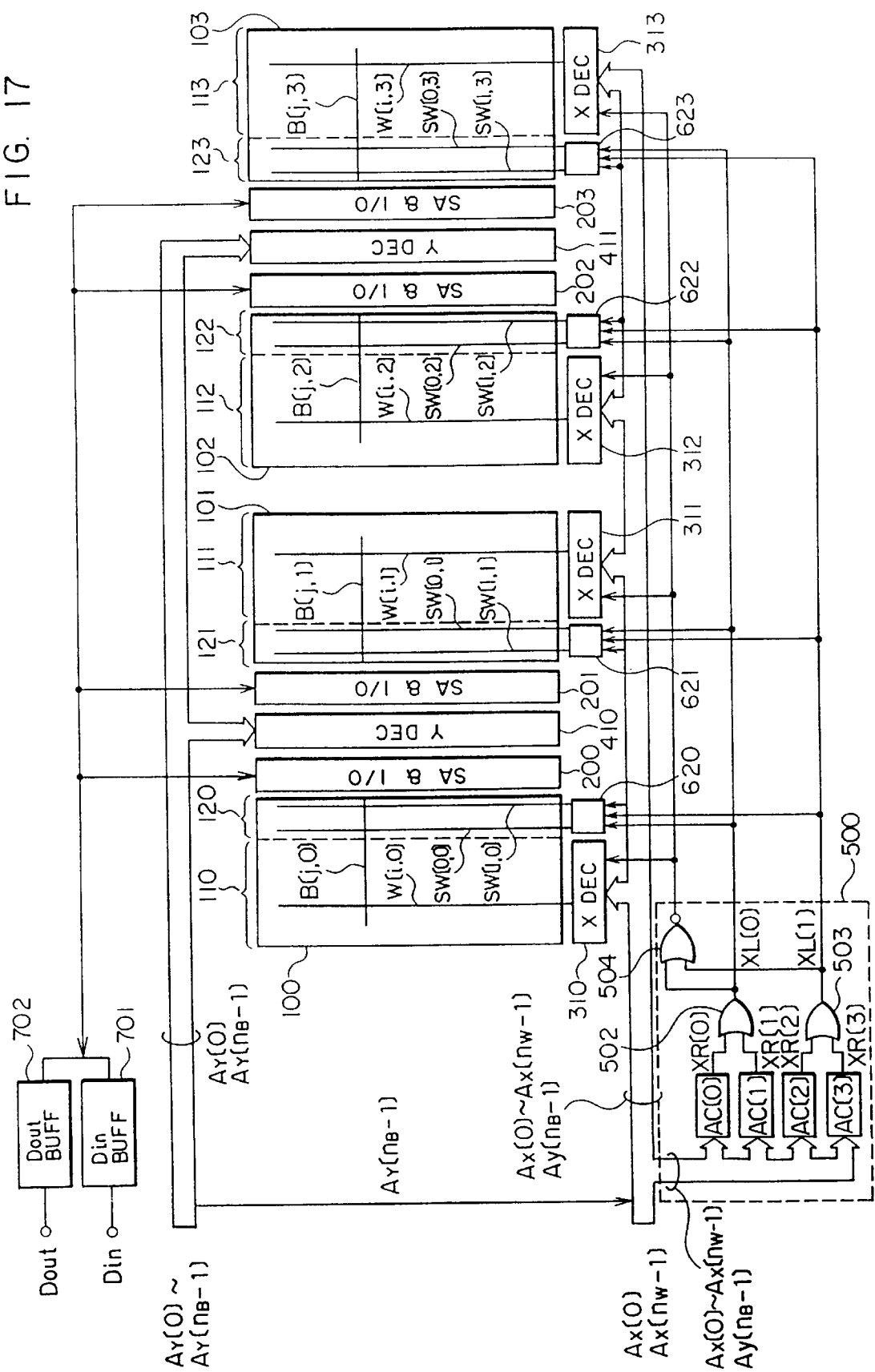
FIG. 17 is a diagrams for explaining the fourth embodiment of the present invention.

FIG. 17 shows the fourth embodiment of a semiconductor memory according to the present invention. In the present embodiment, the outputs XR[0] to XR[3] of four address comparing circuits (generally speaking, R address comparing circuits) are not directly applied to the spare word line selection circuits, but the logical product of two outputs (generally speaking, R/L outputs) is produced. Two signals XL[0] and XL[1] (generally speaking L signals) thus obtained are applied to the spare word line selection circuits. In keeping with such a circuit configuration, each of the spare word line selection circuits has the circuit connection shown in FIG. 15. In each spare word line selection circuit, as shown in FIG. 15, the logical product of the output XL[k], the address signal $A_X[n_W-1]$ (or the complement thereof) and the address signal $A_Y[n_B-1]$ (or the complement thereof) is produced to drive only a spare word memory in a selected memory mat. The address signals $A_X[n_W-1]$ and $A_Y[n_B-1]$ are used for selecting the memory mat. The present embodiment has the following features.

The features of the embodiment of FIG. 14 are also contained in the present embodiment, as they are. That is, the first feature is that the number of wiring conductors which are extended from the redundancy control circuit to the spare word line selection circuits, can be reduced. The second feature is that the electrical connection between the address comparing circuits and the spare word lines can be flexibly changed, and thus each address comparing circuit can be flexibly utilized. The third feature is that the present embodiment is tolerant to the defect in an address comparing circuit. In addition to these features, the present embodiment has the following features. The present embodiment is simpler in circuit construction than the embodiment of FIG. 14. Further, the electrical connection between an address comparing circuit and spare word lines can be changed, not by blowing the fuse of a switching circuit but by varying the address stored in the address comparing circuit. Two bits (that is, $A_X[n_W-1]$ and $A_Y[n_B-1]$) of the address stored in the address comparing circuit specify one memory mat.

In the present embodiment, as is evident from the above explanation, it is preferable to make the number R equal to a multiple of the number L.

The present embodiment is an improved version of the embodiment of FIG. 11. A similar improved version can be constructed for the embodiment of FIG. 9.

The embodiments of FIGS. 11, 14 and 17 are superior to the embodiment of FIG. 9, in that the number m is equal to one (1). However, it is impossible to use the redundancy techniques of FIGS. 11, 14 and 17 as they are, for the purpose of replacing a defective word line included in a DRAM with the ordinary address multiplex system. The first reason is as follows. In the DRAM, it is necessary to refresh memory cells, and thus it is impossible to freely determine the number of word lines which are simultaneously selected. In the embodiment of FIG. 9, $N_B$ memory cells are simultaneously refreshed while in the embodiments of FIGS. 11, 14 and 17, $N_B/2$ memory cells are simultaneously refreshed. Accordingly, in order to apply the redundancy techniques of FIGS. 11, and 17 to a DRAM, it is necessary to vary the repetition frequency of refresh operation. The second reason is that since the address multiplex system is used, a column address is not yet inputted at a time a word line is selected. However, in a case where the above problems do not arise, the redundancy techniques of FIGS. 11, 14 and 17 are applicable. For example, these techniques are applicable to a static RAM, and are also applicable to a DRAM which does not use the address multiplex system, and in which the repetition frequency of fresh operation is not restricted. Even in an ordinary DRAM, the above redundancy techniques can be used for repairing the defect in a bit line. This is because the repetition frequency of refresh operation is not affected by the number of bit lines which are simultaneously selected, and moreover a column address has been inputted at a time a bit line is selected.

Embodiment 5

As is evident from the above, in a case where a defective word line in a DRAM is replaced by a spare word line, it is preferable that memory cells which are simultaneously refreshed, are simultaneously replaced by spared memory cells, as in the embodiment of FIG. 9. Even in a case where a defective word line in a DRAM is replaced by a spare word line, the structure shown in FIG. 18 can make the number m equal to one (1). This is because a memory array is divided into four memory mats in such a manner that each word line is not divided but each bit line is divided into four parts. In the fifth embodiment shown in FIG. 18, a defective word line can be replaced by a spare word line in the same manner as in the embodiment of FIG. 17. In the present embodiment, however, $N_B$ memory cells are simultaneously refreshed and only row address signals are used for specifying a memory mat, as in the embodiment of FIG. 9.

Figure 18:
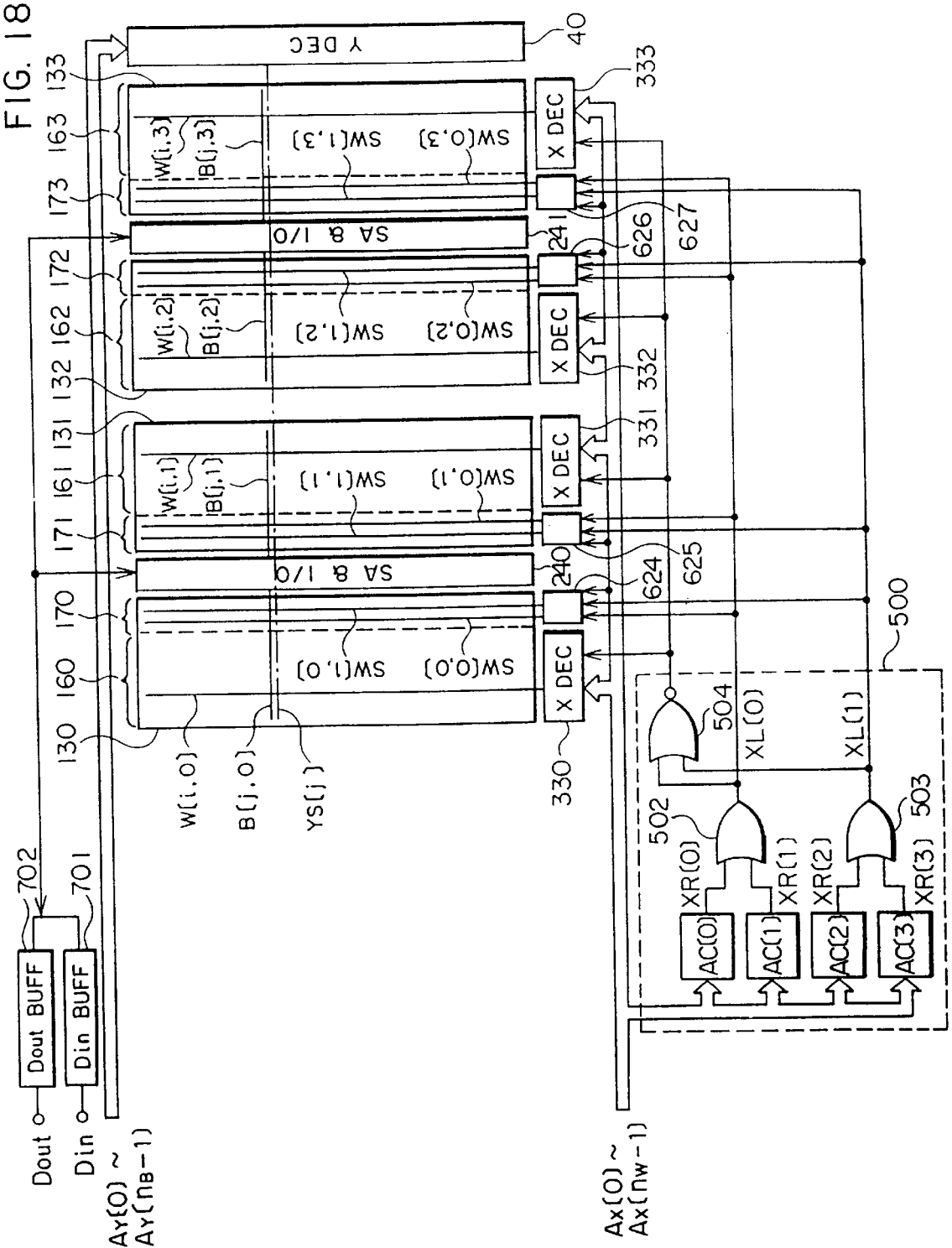
FIG. 18 is a diagrams for explaining the fifth embodiment of the present invention.

In the present embodiment, a single Y-decoder 40 is provided at an end of the memory, and an output YS[j] of the Y-decoder is supplied to each memory mat through a wiring conductor which is indicated by a dot-dash line in FIG. 18. That is, a technique is used which is called "multi-division bit line", and a plurality of memory mats have one Y-decoder in common, to reduce a chip area. Further, two memory mats use a circuit block which includes sense amplifiers and input/out lines, in common. In more detail, memory mats 130 and 131 use a circuit block 240 in common, and memory mats 132 and 133 use a circuit block 241 in common. This technique is called "shared sense", and is effective in reducing the area of sense amplifiers. The "multi-division bit line" and the "shared sense" are described, for example, on pages 282 and 283 of the IEEE-ISSCC Digest of Technical Papers, February, 1984, and in U.S. Pat. No. 4,675,845.

In the first to fifth embodiment, a word line is replaced by a spare word line in accordance with the present invention. However, the present invention is not limited to a word line, but is applicable to the replacement of a bit line by a spare bit line.

Embodiment 1 of Address Comparing Circuit

Figure 19:
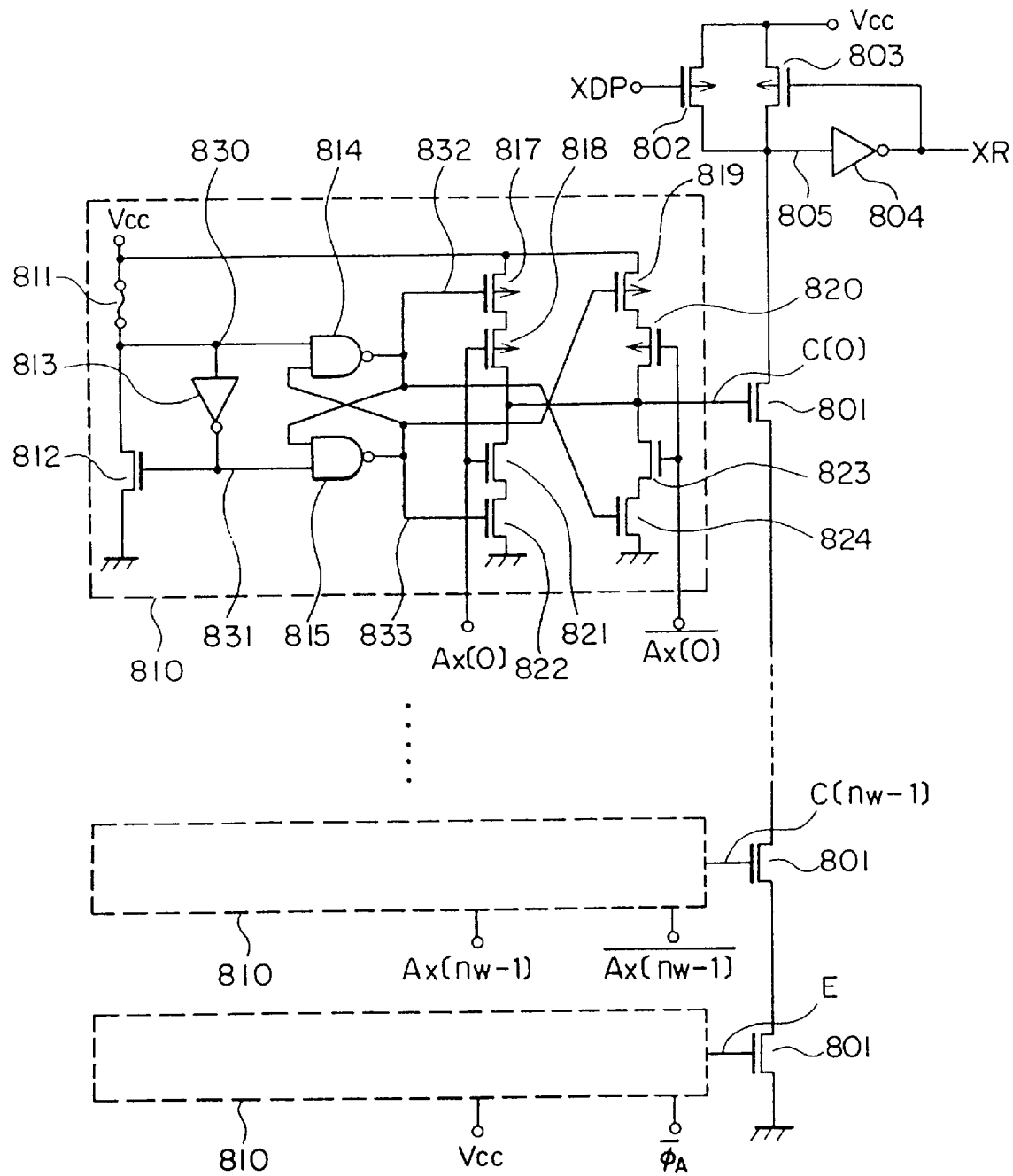
FIG. 19 is a diagram showing the first embodiment of an address comparing circuit used in the present invention.

Next, explanation will be made of an address comparing circuit used in the present invention. FIG. 19 shows an embodiment of an address comparing circuit included in the semiconductor memory of FIG. 9. In FIG. 19, reference numeral 801 designates an N-channel MOS transistor, 802 and 803 P-channel MOS transistors, 804 an inverter, 810 a bit comparing circit for storing therein one bit of a wrong (e.g., defective) address to compare one bit of an applied address with the stored bit, 811 a fuse which can be blown by a laser beam, 812 and 821 to 824 N-channel MOS transistors, 817 to 820 P-channel MOS transistors, 813 an inverter, and 814 and 815 NAND gates. Now, explanation will be made of the operation of the address comparing circuit of FIG. 19.

First, a pre-charge signal XDP is brought to a low level, to make the transistor 802 conductive, thereby setting a node 805 to a high potential level. At this time, an output XR has a low level. Next, address signals $A_X[i]$ (where i=0, 1, . . . $n_W$–1) are applied to bit comparing circuits 810. Each bit comparing circuit 810 compares one bit stored therein (namely, one bit of a wrong address stored in the address comparing circuit) with an address signal $A_X[i]$. When the address signal $A_X[i]$ coincides with the stored bit, an output C[i] has a high level. When the above address signal does not coincide with the stored bit, the output C[i] has a low level. When the results of comparison in all the bit comparing circuits indicate coincidence, all of the transistors 801 are put in a conductive state. Thus, the node 805 is discharged, and has a low potential level. At this time, the output XR has a high level. That is, it is judged (for example, a determination is made) that the applied address coincides with the stored wrong address. In a case where at least one bit of the applied address does not coincide with a corresponding one bit of the stored wrong address, the node 805 is not discharged, and hence the output XR is kept at the low level. The transistor 803 has relatively small transfer conductance, and is used for latching the potential of the node 805. When the node 805 is not discharged, the output XR has the low level, and hence the transistor 803 is made conductive. Thus, the potential of the node 805 is kept at the high level.

Next, the bit comparing circuit 810 will be explained in detail. In the bit comparing circuit, the logical value of one bit of a wrong address is indicated by whether or not the fuse 811 is blown. In FIG. 19, a state that the fuse is not blown, corresponds to a logical value "0", and a state that the fuse is blown, corresponds to a logical value "1". In a case where the fuse is not blown, a node 830 has a high potential level, and a node 831 has a low potential level. Nodes 832 and 833 on the output side of a latch circuit,which is formed of cross-coupled NAND gates 814 and 815, have low and high potential levels, respectively. Accordingly, when the address signal $A_X[i]$ indicates a logical value "0", that is, when the address signal $A_X[i]$ has a low level and the complement thereof $\overline{A_X[i]}$ has a high level, the output C[i] has the high level. In a case where the fuse is blown, the potentials of the nodes 830 to 833 are reversed. Thus, when the address signal $A_X[i]$ indicates a logical value "1", the output C[i] has the high level.

One of the bit comparing circuits is not applied with the signals $A_X[i]$ and $\overline{A_X[i]}$, but is applied with a source voltage Vcc and a timing signal $\overline{\Phi_A}$ which is put from a high level to a low level in synchronism with the level change of the address signal, to be used as an enable circuit. It is determined by the enable circuit whether or not the address comparing circuit is used for repairing a defect. In a case where the address comparing circuit is used, the fuse of the enable circuit is blown. When this fuse is not blown, the output E of the enable circuit is always kept at a low level, and thus the output Xr of the address comparing circuit is always kept at a low level.

As mentioned above, in the embodiments of FIGS. 11, 14 and 17, the column address signal $A_Y[n_B–1]$ is compared with stored data. This comparison can be carried out by adding one bit comparing circuit 810 and one MOS transistor 801 to the address comparing circuit of FIG. 19.

A device for storing a wrong address is not always required to include a fuse which can be blown by a laser beam, but may include a fuse which can be electrically blown, or may be formed of a nonvolatile memory such as an EPROM.

Embodiment 2 of Address Comparing Circuit

Figure 20:
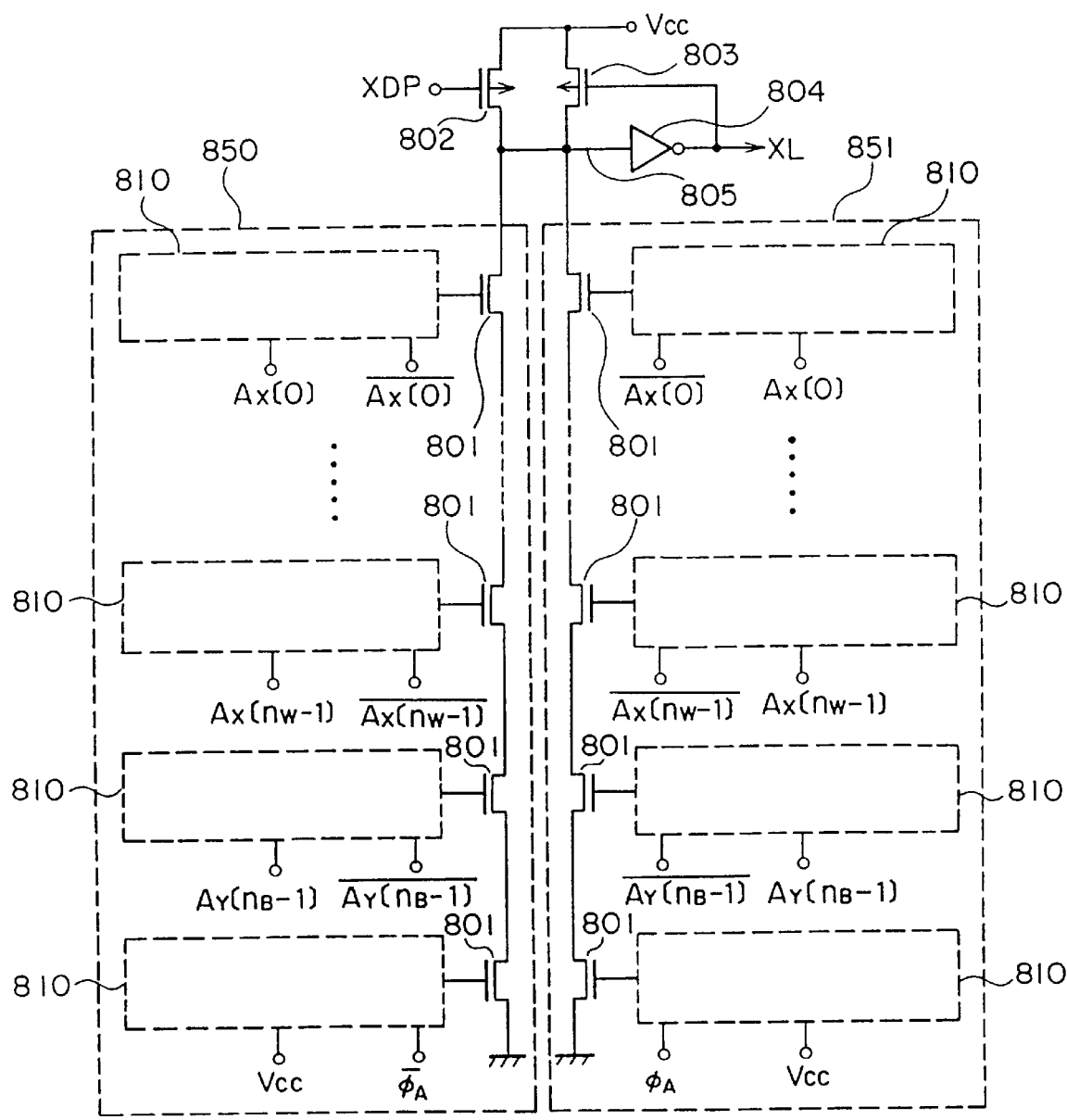
FIG. 20 is a diagram showing the second embodiment of an address comparing circuit used in the present invention.

FIG. 20 shows another embodiment of an address comparing circuit. This embodiment is suitable for use in the semiconductor memories of FIGS. 17 and 18. The present embodiment is different from the embodiment of FIG. 19 in that a pair of circuit blocks 850 and 851 each including a plurality of bit comparing circuits 810 and N-channel MOS transistors 801 are provided. Two wrong (e.g., defective) addresses are stored in the circuit blocks 850 and 851. The operation of the present embodiment will be explained below.

First, the pre-charge signal XDP is put to a low level, to set the node 805 to a high potential level. Next, the address signals $A_X[i]$ (where i=0, 1, . . . $n_W$–1) are applied to the circuit blocks 850 and 851. Thus, the address signals are compared with wrong addresses stored in the circuit blocks 850 and 851. When the applied address coincides with one of the wrong addresses, the node 805 is discharged, and thus the output Xr has a high level.

As is evident from the above explanation, the present embodiment is equivalent to the combination of two address comparing circuits and one OR gate 502 or 503 in the redundancy control circuit of FIG. 17 or 18. Accordingly, when the present embodiment is used, the OR gate can be omitted from the redundancy circuit. Moreover, the discharge time of the node 805 is the same as in the embodiment of FIG. 19, and thus a delay time due to the OR gate can be eliminated.

Now, let us consider a case where troubles with a bit line are generated in the memory of FIG. 18. In this case, defects may occur in a plurality of memory mats, since the memory mats use the Y-decoder and a sense amplifier in common. This problem can be solved by storing not only logical values "0" and "1" but also a don't-care value "X" in the address comparing circuit, as will be explained below. Now, explanation with be made of embodiments of a semiconductor memory according to the present invention which embodiments utilize the don't-care value.

Embodiment 6

Figure 21:
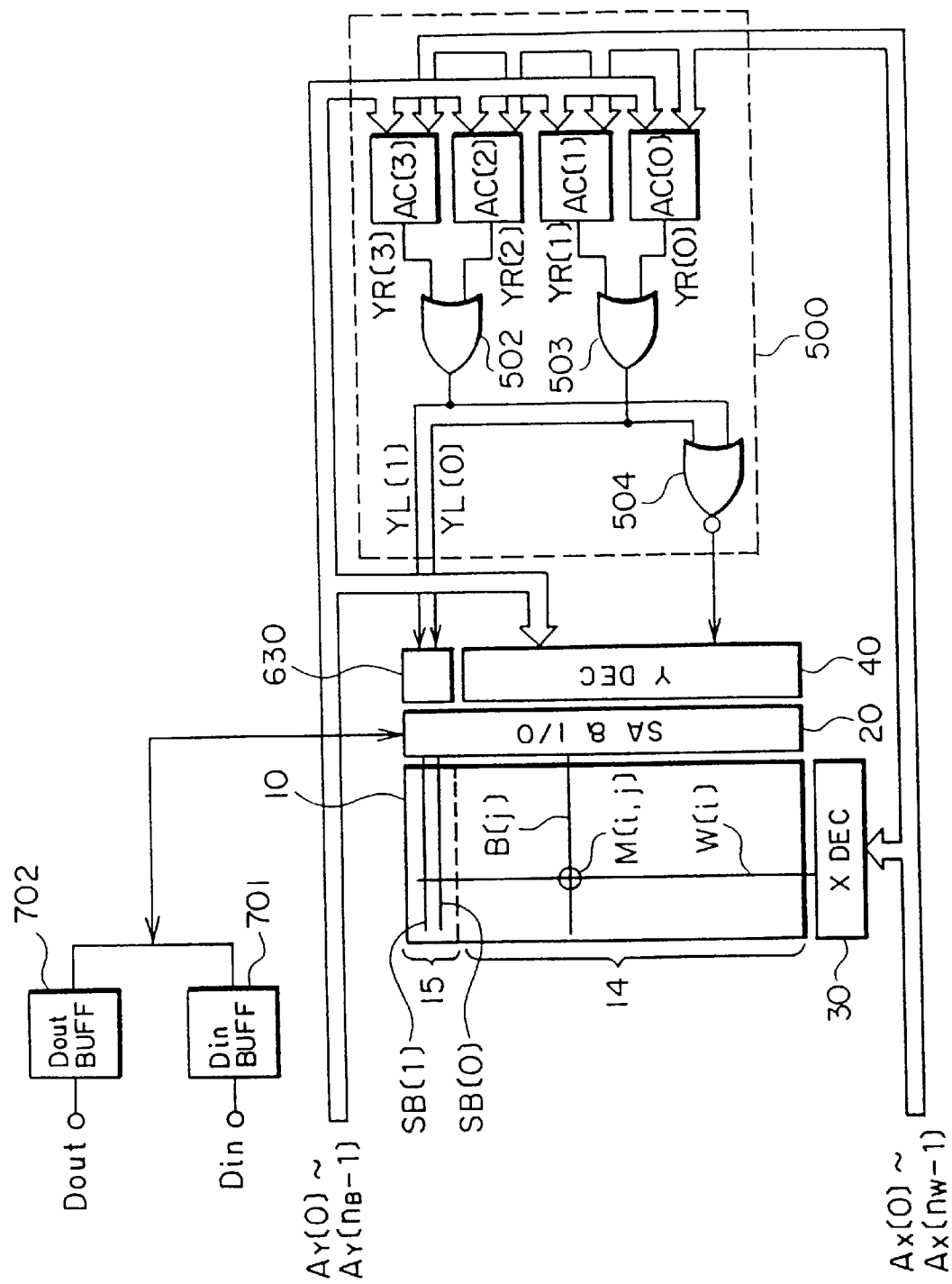

FIG. 21 shows the sixth embodiment of a semiconductor memory according to the present invention. In FIG. 21, reference numeral 10 designates a memory array, 20 sense amplifiers and input/output lines, 30 an X-decoder, 40 a Y-decoder, 500 a redundancy control circuit, 630 a spare bit line selection circuit (having the same circuit construction as that of FIG. 33), 701 a data input buffer, and 702 a data output buffer. The memory array 10 includes a region 14 where regular memory cells are arranged, and a region 15 where spare memory cells are arranged. In the region 14, $N_W \times N_B$ memory cells $M[i, j]$ are disposed at two-level crossings of $N_W$ word lines $W[i]$ (where i=0, 1, ... $N_W$–1) and Nb bit lines $B[j]$ (where j=0, 1, ... $N_B$–1). In the region 15, $N_W \times L$ spare memory cells (in the figure, L=2) are disposed at two-level crossings of $N_W$ word lines and L spare bit lines $SB[k]$ (where k=0, ... L–1). Although the folded bit line structure is used in the present embodiment, the present invention is also applicable to a case where the open bit line structure is used.

Figure 2A:
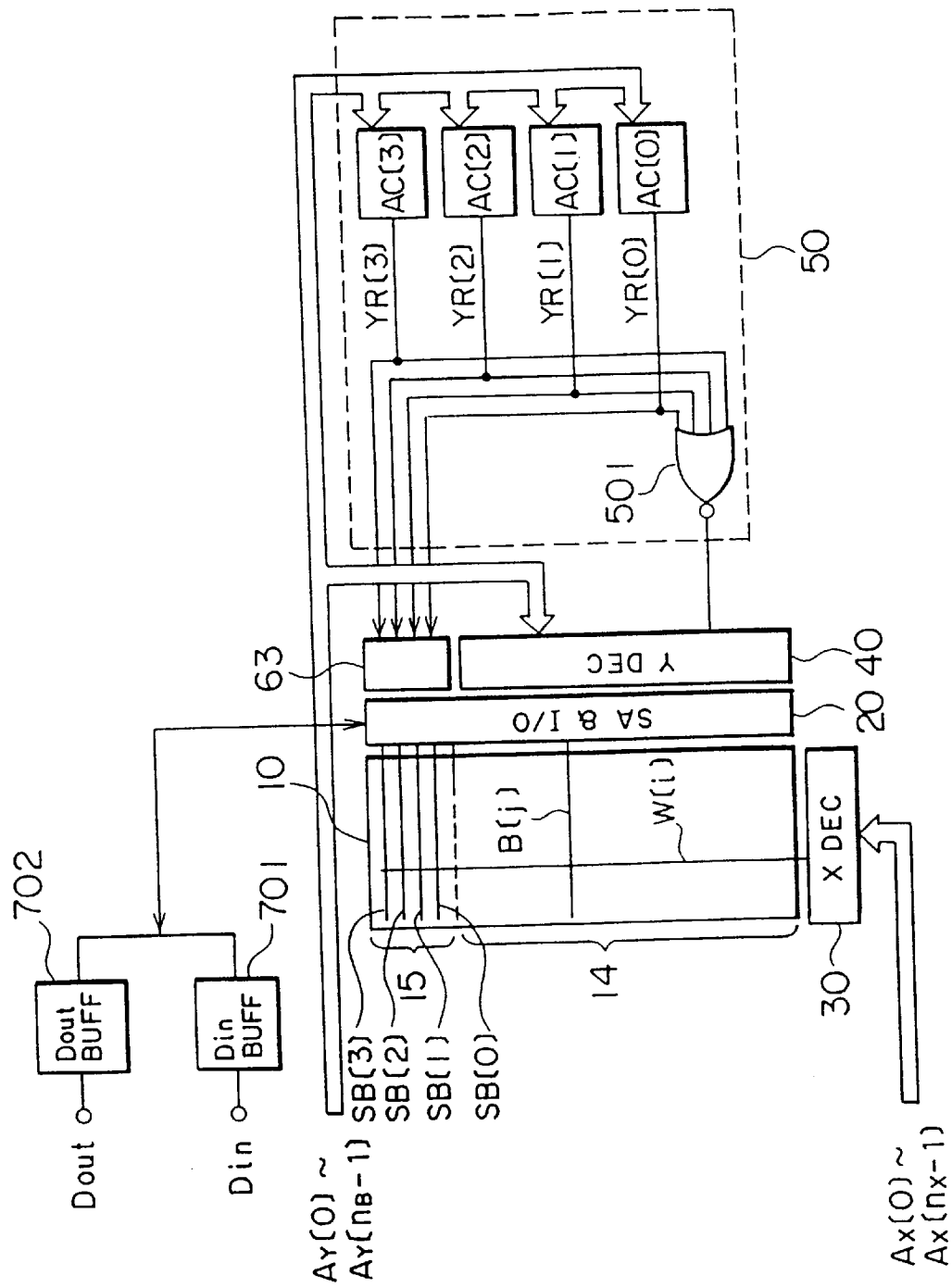
Figure 2B:
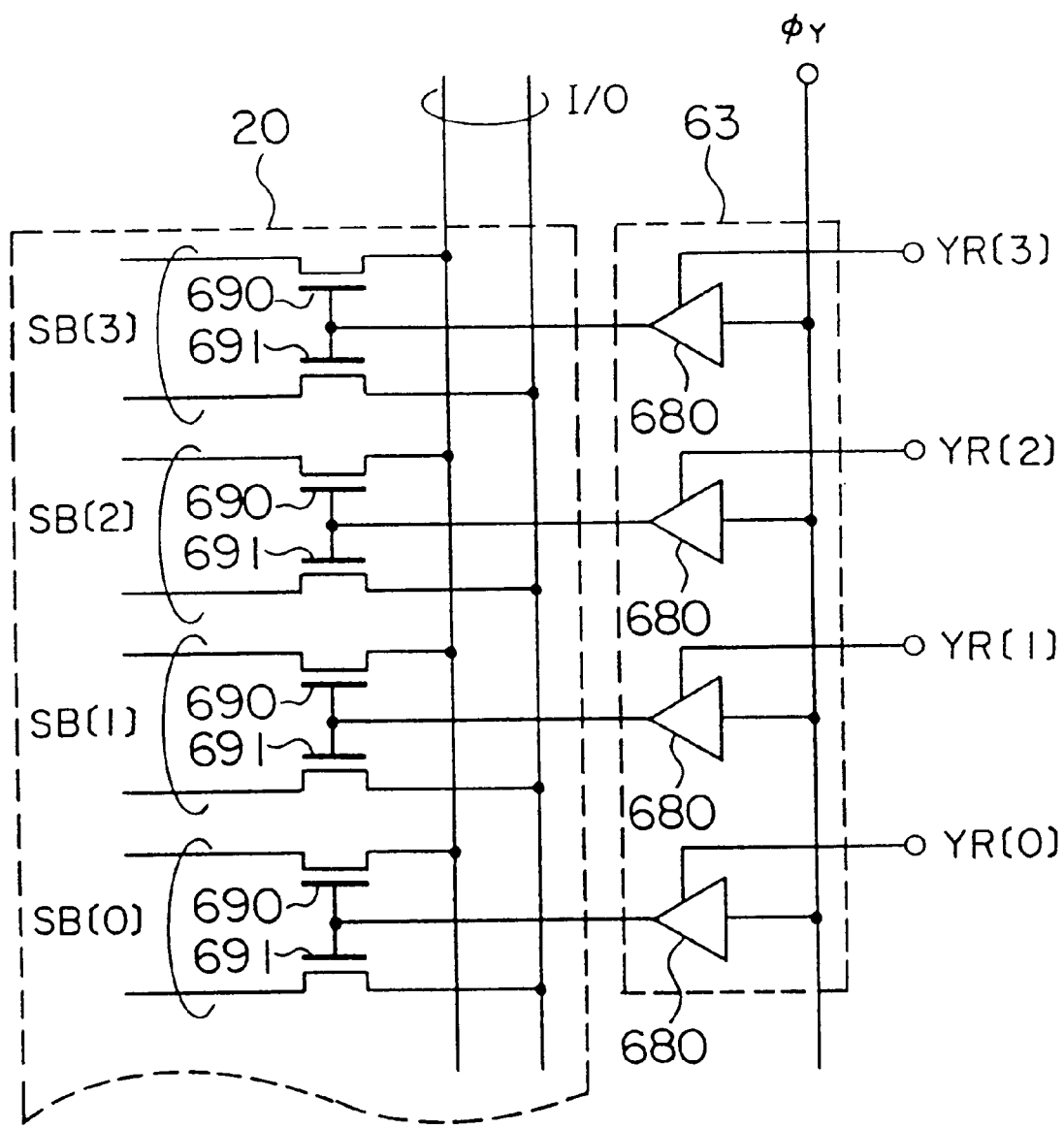

Now, explanation will be made of the features of the redundancy technique used in the present embodiment. The features reside in that not only column address signals but also row address signals $A_x[0]$ to $A_x[n_W-1]$ are applied to each address comparing circuit, and a don't-care value "X" can be stored in each address comparing circuit. Thus, it is possible to compare the applied address with a stored address, or not to compare the applied address with any data. In the conventional redundancy technique of FIG. 2A, only the applied column address is compared with the column address stored in the address comparing circuit, to replace regular memory cells belonging to one bit line by spare memory cells. According to the present embodiment, when the applied row address is not compared with any data, regular memory cells belonging to one bit line are simultaneously replaced by spare memory cells. When not only the column address but also the row address is compared with stored data, a regular memory cell can be replaced by a spare memory cell, bit by bit.

Now, the redundancy technique in the present embodiment will be explained below, with reference to FIG. 22. FIG. 22 is a table showing examples of the replacement method which can be carried out by the redundancy control circuit of the present embodiment, that is, how many regular memory cells are simultaneously replaced by spare memory cells. In the table of FIG. 22, a sign ○ indicates that an input address signal is compared with a stored value, (that is, a logical value "0" or "1" is stored in a bit comparing circuit) and a sign × indicates that the input address signal is not compared with any data, (that is, a don't-care value "X" is stored in the bit comparing circuit). When all of row address signals and column address signals are compared with stored data, as shown in the first column of the table, a regular memory cell can be replaced by a spare memory cell, bit by bit. When the row address signals are not compared with any data, as shown in the third column of the table, one bit line is replaced by a spare bit line. Further, when only the rightmost bit of the input row address is not compared with any data, as shown in the second column, a pair of regular memory cells are simultaneously replaced by spare memory cells.

As mentioned above, it is one feature of the present embodiment to use the row address in repairing a defect with respect to a bit line. In the conventional redundancy technique, only the row address is used for replacing a defective word line by a spare word line, and only the column address is used for replacing a defective bit line by a spare bit line. When the row address is used for repairing a defect with respect to a bit line, as in the present embodiment, or when the column address is used for repairing a defect with respect to a word line, various replacement methods mentioned above can be realized.

It is an advantage of the present invention to make it possible to take a carefully thought-out measure for various defects in a semiconductor memory by using the above-mentioned replacement methods. In general, defects in a semiconductor memory include a single-bit defect (which is generated by, for example, a pin hole in the capacitor of a memory cell), a pair-bit defect (which is caused by, for example, a bad contact), a bit-line defect (which is generated by, for example, the breaking of a bit line), and others. According to the conventional technique of FIG. 2A, even when a single-bit defect is generated, a bit line containing a defective memory cell is replaced by a spare bit line. While, according to the present embodiment, when a single-bit defect is generated, only a defective memory cell is replaced by a spare memory cell. Further, when a pair-bit defect is generated, only two defective memory cells are replaced by spare memory cells. It is needless to say that when a bit-line defect is generated, a defective bit line can be replaced by a spare bit line. As mentioned above, according to the present embodiment, only a minimum number of regular memory cells are replaced by spare memory cells. Thus, the probability that a defective memory cell is included in the spare memory cells substituted for the regular memory cells, is reduced, since the probability that all the spare memory cells are non-defective, is inversely proportional to an exponential function having the number of spare memory cells as the power.

Further, according to the present embodiment, a minimum number of spare memory cells necessary for repairing a defect are used, and thus the utilization efficiency of spare memory cells is improved. For example, let us consider a case where regular memory cells $M[i_1, j_1]$ and $M[i_2, j_2]$ are defective (where $i_1 \neq i_2$ and $j_1 \neq j_2$). According to the redundancy technique of FIG. 2A, two spare bit lines are required for repairing such defects. While, according to the present embodiment, the wrong addresses $[i_1, j_1]$ and $[i_2, j_2]$ are stored in, for example, the address comparing circuits AC[0] and AC[1], respectively. Then, the defects can be repaired by using only a spare bit line SB[0]. Accordingly, another spare bit line SB[1] can be used for repairing other defects. Thus, the manufacturing yields of a semiconductor memory can be improved.

Next, the redundancy control circuit 500 will be explained in detail. The redundancy control circuit of the present embodiment includes R address comparing circuits AC[k] (where k=0, 1, ... R−1), OR gates 502 and 503, and an NOR gate 504. The redundancy control circuit generally includes L OR gates, each of which produces the logical sum of the outputs of R/L address comparing circuits. In FIG. 21, however, R=4, and R/L=2. Two of the outputs YR[0] to YR[3] of R(=4) address comparing circuits are applied to the OR gate 502, and the remaining outputs are applied to the OR gate 503. The signals YL[0] and L[1] outputted from the OR gates 503 and 502 are applied to the spare bit line selection circuit 630, to select a spare bit line. When one of the outputs YR[0] to YR[3] has a high level, the NOR gate 504 disables the Y-decoder 40.

An advantage of the present invention is that the degree of freedom in determining the number L of spare bit lines and the number R of address comparing circuits is large. In the conventional redundancy technique, the whole of a regular bit line is replaced by a spare bit line, and hence it is required to satisfy a relation L=R. For example, in the memory of FIG. 2A, L=R=4. While, according to the present invention, the number L and the number R can be relatively freely selected, and hence a redundancy control circuit can be formed which is small in area and high in operation efficiency. The relation between the number L and the number R will be explained below.

When the number of regular memory cells which are replaced by spare memory cells at one time, is expressed by b, the following relation is generally satisfied:

$$L \leq R \leq LN_W/b, \quad (3)$$

The inequality sign on the left side indicates that it is nonsense to make the number of spare lines greater than the number of address comparing circuits. The inequality sign on the right side has the following meaning. The number of spare memory cells is $LN_W$, and b spare memory cells are simultaneously substituted for regular memory cells. Accordingly, $LN_W/b$ replacement operations can be performed. Hence, it is nonsense to make the number of address comparing circuits greater than $LN_W/b$. In the conventional technique, in which the whole of a regular bit line is replaced by a spare bit line, a relation $b=N_W$ exists, and hence it is required satisfy a relation L=R. While, according to the resent embodiment, the number b can be freely selected, provided that a relation $1 \leq b \leq N_W$ is satisfied. Accordingly, the degree of freedom in determining the number L and the number R is increased.

When viewed from the standpoint of chip area, it is preferable to increase the number R rather than than the number L. This is because an area for one address comparing circuit is generally smaller than an area necessary for providing one spare line in each memory mat. In the redundancy technique of FIG. 2A, it is required to satisfy the relation L=R, and hence it is impossible to increase only the number R. According to the present invention, only the number R can be increased. That is, it is possible to make the number L relatively small and to make the number R relatively large. Thus, a redundancy control circuit can be formed which is small in area and high in operation efficiency. In other words, the gist of the present invention is to satisfy a relation which is obtained by eliminating the equality sign on the left side from the formula (3), that is, the following relation:

$$L < R \leq LN_W/b \quad (4)$$

For example, in the present embodiment shown in FIG. 21, L=2, and R=4. As is evident from this example, it is preferable to make the number R equal to a multiple of the number L.

Embodiment 7

Figure 23:
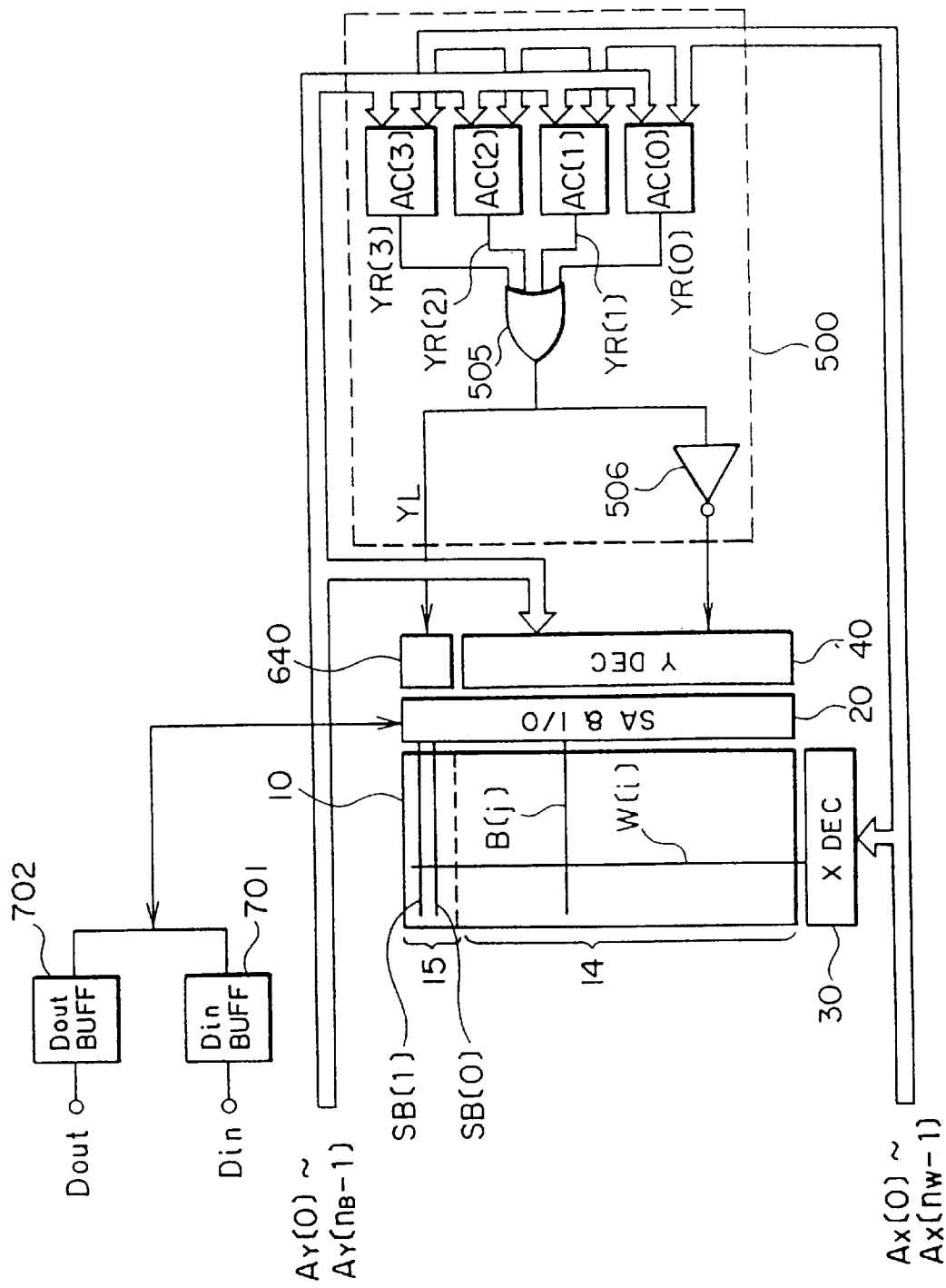
Figure 24A:
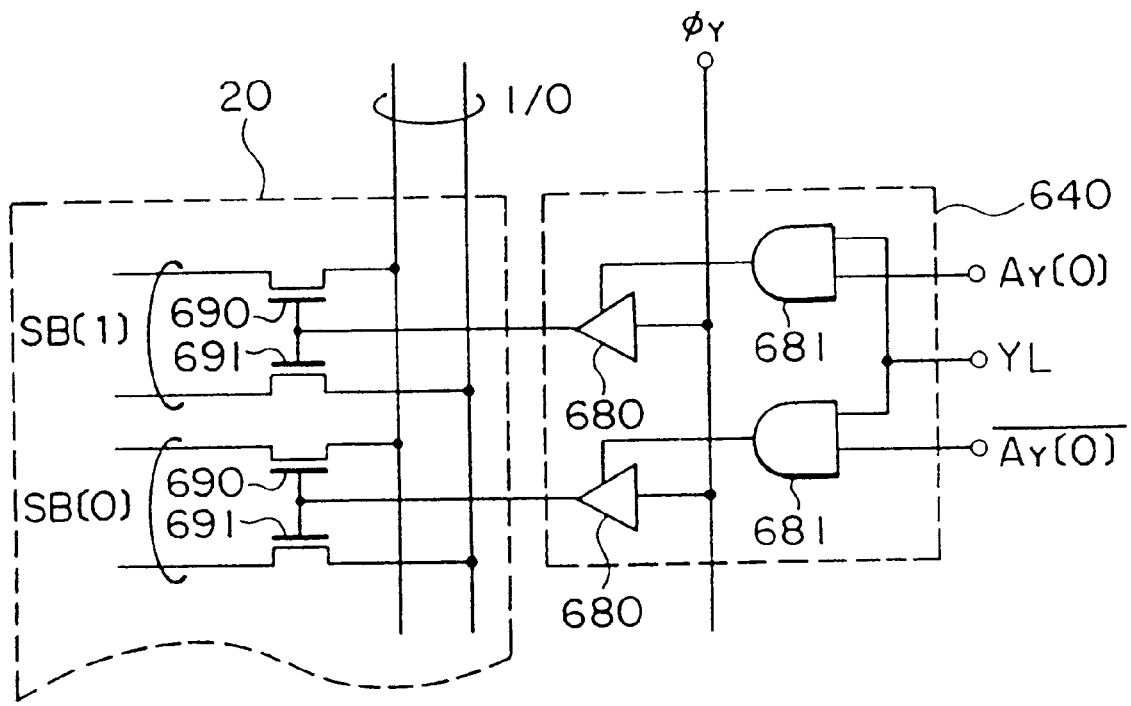
Figure 24B:
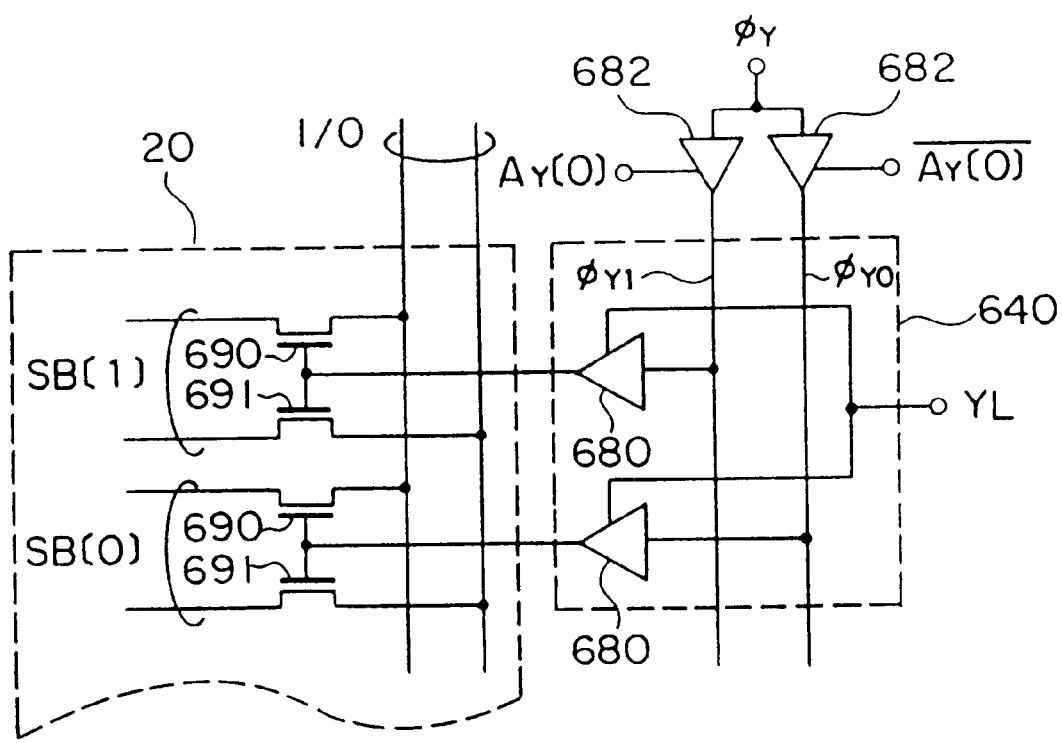

FIG. 23 shows the seventh embodiment of a semiconductor memory according to the present invention. The present embodiment is different from the embodiment of FIG. 21, in the wiring method for the outputs of address comparing circuits. In the present embodiment, a signal YL which is the logical sum of the outputs YR[0] TO YR[3], is applied to a spare bit line selection circuit 640. In keeping with such circuit connection, the spare bit line selection circuit 640 has a circuit structure shown in FIG. 24A or 24B. This circuit structure is used for preventing the multiple selection of spare bit lines. In FIG. 24A, the logical product of the signal YL and an address signal $A_Y[0]$ for selecting a bit line (or the complement of the address signal) is produced, to specify only one spare bit line. Further, in FIG. 24B, a bit line selection signal $\Phi_Y$ is pre-decoded by the address signal $A_Y[0]$ and the complement thereof, and the signals $\Phi_{Y0}$ and $\Phi_{Y1}$ thus obtained are used for specifying only one spare bit line.

A feature of the present embodiment is that two bit lines can be used as one unit in a replacement operation. Now, this feature will be explained, with reference to a table shown in FIG. 25. The first, second and fifth columns of the table correspond to a single-bit defect, a pair-bit defect and a bit-line defect, respectively, as in FIG. 22. The third column of the table corresponds to a pair-bit defect of different type, that is, a case where adjacent bits on the same word line are defective. It is to be noted that the second column corresponds to a case where adjacent bits on the same bit line are defective. Such pair-bit defects are caused by the short circuit between the capacitors of adjacent memory cells. The fourth column of the table corresponds to a case where 2×2 memory cells are defective. In a static RAM, this defect is caused by, for example, a bad contact. The sixth column of the table corresponds to a case where two bit lines which are adjacent to each other, are defective. This defect is caused by, for example, the short circuit between the bit lines. According to the present embodiment, various defects which have been mentioned above, can be readily repaired.

Another feature of the present embodiment is that the number of wiring conductors which are extended from the redundancy control circuit 500 to the spare bit line selection circuit 640, is reduced.

Embodiment 8

Figure 26:
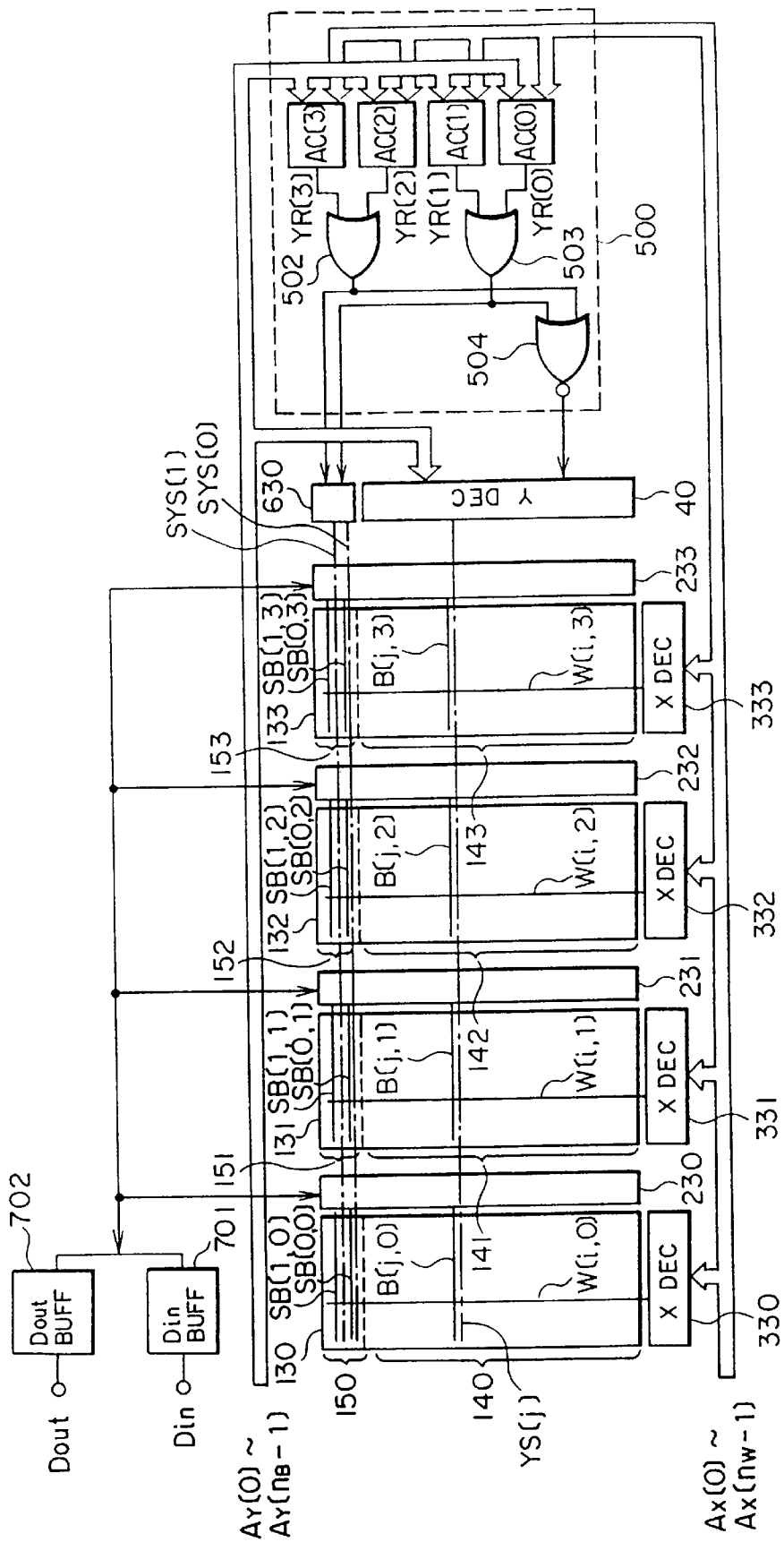

FIG. 26 shows the eighth embodiment of a semiconductor memory according to the present invention. The present embodiment is different from the embodiments of FIGS. 21 and 23 in that a memory array is divided into a plurality of memory mats (in the figure, four memory mats 130 to 133) in a direction parallel to bit lines. Each memory mat includes a region 140, 141, 142, or 143 where regular memory cells are arranged, and a region 150, 151, 152, or 153 where spare memory cells are arranged. In each of the regions 140 to 143, $N_W \times N_B/4$ memory cells are disposed at two-level crossings of $N_W/4$ word lines W[i, n] (where i=0, 1, ... $N_W/4-1$, and n=0, 1, ..., 3) and $N_B$ bit lines B[j, n] (where j=0, 1, ... $N_B-1$, and n=0, 1, ... 3). In each of the regions 150 to 153, $N_W \times L/4$ spare memory cells (in the figure, L=2) are disposed at two-level crossings of $N_W/4$ word lines W[i, n] (where i=0, 1, ... $N_W/4-1$, and n=0, 1, ... 3) and L spare bit lines SB[k, n] (where k=0, ... L−1, n=0, 1, ... 3). Circuit blocks 230 to 233 each including sense amplifiers and input/output lines are provided so as to correspond to the memory mats 130 to 133, respectively. However, only a single Y-decoder 40 is provided in an end portion. An output YS[j] of the Y-decoder is applied to each memory mat through a wiring conductor which is indicated by a dot-dash line in FIG. 26. Similarly, an output SYS[k] of the spare bit line selection circuit 630 is applied to each memory mat through a wiring conductor which is indicated by another dot-dash line in FIG. 26. A technique which is called "division of bit line", is used in the present embodiment. That is, a plurality of memory mats use one Y-decoder in common, and thus a chip area is reduced.

The present invention is specifically effective for a semiconductor memory, in which a plurality of memory mats use circuit means (for example, a Y-decoder and output lines thereof) in common, such as the present embodiment. The reason for this is as follows. When a fault is generated in the common circuit means, a defect may be generated in a plurality of memory mats. According to the present invention, such a defect can be readily repaired, as will be explained below with reference to a table shown in FIG. 27. The first and second columns of the table correspond to single-bit and pair-bit defects, respectively, as in FIG. 22. The third column of the table corresponds to a bit-line defect. In the present embodiment, however, the memory array is divided into four memory mats. Accordingly, address signals for specifying one of the memory mats (that is, address signals $A_X[n_W-1]$ and $A_X[n_W-2]$ indicative of two leftmost bits of a row address) are compared with stored data. Thus, only a bit line in the specified memory mat is replaced by a spare bit line. The fourth column of the table corresponds to a case where the Y-decoder is defective. In this case, the address signals $A_X[n_W-1]$ and $A_X[n_W-2]$ are not compared with any data. Thus, corresponding bit lines in four memory mats are simultaneously replaced by spare bit lines.

Embodiment 9

FIG. 28 shows the ninth embodiment of a semiconductor memory according to the present invention. The present embodiment is different from the embodiment of FIG. 26 in that two memory mats use a circuit block which includes sense amplifiers and input/output lines, in common. That is, the memory mats 130 and 131 use a circuit block 240 in common, and the memory mats 132 and 133 use a circuit block 241 in common. This technique is called "shared sense", and can reduce an area necessary for sense amplifiers.

According to the present embodiment, when a fault is generated in a sense amplifier, corresponding bit lines in the memory mats on the left and right sides of the sense amplifier become defective. Such defects can be readily repaired, as will be explained below with reference to a table shown in FIG. 29. The first, second, third and fifth columns of table correspond to a single-bit defect, a pair-bit defect, a bit-line defect and a Y-decoder defect, respectively, as in FIG. 27. The fourth column of the table corresponds to a case where a sense amplifier is defective. In this case, an address signal for specifying one of a memory mat group 130 and 131 and a memory mat group 132 and 133 (that is, address signal $A_X[n_W-1]$ indicative of the leftmost bit of a row address) is compared with stored data. Thus, corresponding bit lines in memory mats which exist on both sides of the defective sense amplifier are simultaneously replaced by spare bit lines.

In the sixth to ninth embodiments, a defect with respect to a bit line has been repaired. However, an inventive redundancy technique utilizing a don't-care value is also applicable to a case where a defect with respect to a word line is repaired.

Embodiment 3 of Address Comparing Circuit

Figure 30:
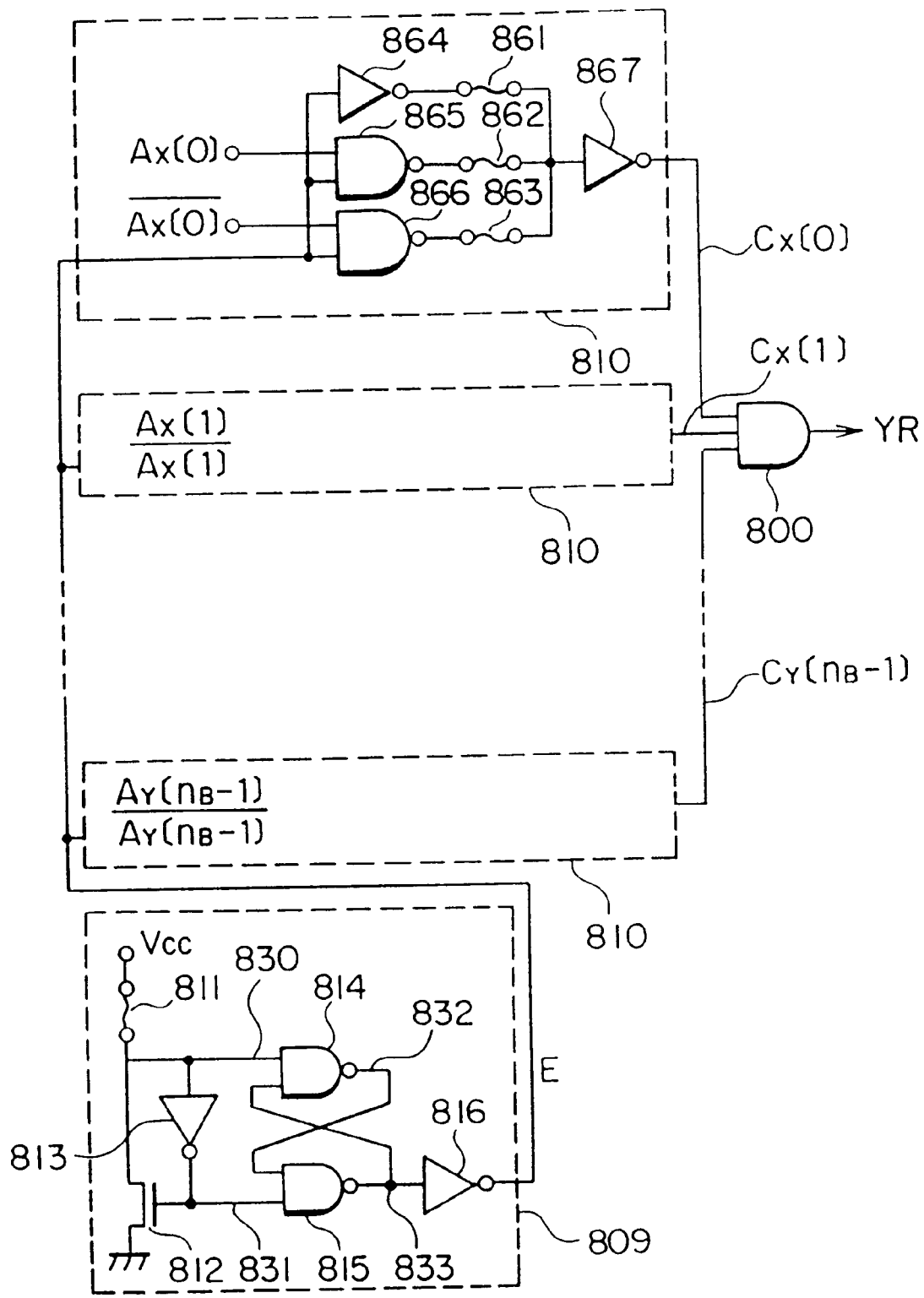
FIG. 30 is a diagram showing the third embodiment of an address comparing circuit used in the present invention.

Next, explanation will be made of an address comparing circuit which is used in the sixth to ninth embodiments of a semiconductor memory according to the present invention. The feature of the above address comparing circuit is that three kinds of values "0", "1" and "X" can be stored in the address comparing circuit, to indicate a wrong address. FIG. 30 shows the third embodiment of an address comparing circuit. In FIG. 30, reference numeral 800 designates an AND gate, 810 a bit comparing circuit for storing one bit of a wrong address to compare one bit of an applied address with the stored bit, 861 to 863 fuses which can be blown by a laser beam, 864 and 867 inverters, 865 and 866 NAND gates, 809 an enable circuit for determining whether or not the address comparing circuit is to be used in a redundancy circuit, 811 a fuse which can be blown by a laser beam, 812 an N-channel MOS transistor, 813 and 816 inverters, and 814 and 815 NAND gates. The operation of the address comparing circuit will be explained below.

The enable circuit will first be explained. In a case where the address comparing circuit is used for repairing a defect, the fuse 811 of the enable circuit is first blown. Thus, a node 830 is brought to a low potential level, a node 831 is put to a high potential level, a node 832 has a high potential level, and a node 833 has a low potential level. Accordingly, an enable signal E has a high level. In a case where the fuse 811 is not blown, the potential levels of the nodes 830 to 833 are reversed, and thus the enable signal E has a low level.

Next, the bit comparing circuit will be explained. The bit comparing circuit 810 compares a value which is stored in accordance with the state of the fuses 861 to 863, with an address signal $A_X[i]$ (or $A_Y[j]$). When the address signal coincides with the stored value, an output $C_X[i]$ (or $C_Y[j]$) has a high level. When the address signal does not coincide with the stored value, the output has a low value. The fuses 861 to 863 are treated as follows. In a case where a logical value "0" is stored, the fuses 861 and 862 are blown. Thus, when an address indicates a logical value "0", that is, when the address signal $A_X[i]$ (or $A_Y[j]$) has a low level, and the complement thereof $\overline{A_X[i]}$ (or $\overline{A_Y[j]}$) has a high level, the output $C_X[i]$ (or $C_Y[j]$) has a high level. In a case where a logical value "1" is stored, the fuses 861 and 863 are blown. Thus, when an address indicates a logical value "1", that is, when the address signal $A_X[i]$ (or $A_Y[j]$) has a high level, and the complement thereof $\overline{A_X[i]}$ or $\overline{A_Y[j]}$) has a low level, the output $C_X[i]$ (Or $C_Y[j]$) has a high level. In a case where the value "X" is stored, the fuses 862 and 863 are blown. In this case, the output $C_X[i]$ (or $C_Y[j]$) has a high level, independently of the applied address. When coincidence is shown in all the bit comparing circuits, the output YR of the AND gate 800 has a high level. That is, it is judged that an applied address coincides with the wrong address. In a case where at least one bit of the applied address does not coincide with the stored value, the output YR has a low level. The above operation is performed in a case where the enable signal E has a high level. In a case where the enable signal E has a low level, the output $C_X[i]$ (or $C_Y[j]$) of each bit comparing circuit has a low level, and thus the output YR has a low level.

It is a feature of the present embodiment to be able to make small the circuit scale of an address comparing circuit and the area occupied by the circuit.

A device for storing a wrong address is not always required to include a fuse which can be blown by a laser beam, but may include a fuse which can be electrically blown, or may be formed of a nonvolatile memory such as an EPROM.

Embodiment 4 of Address Comparing Circuit

Figure 31:
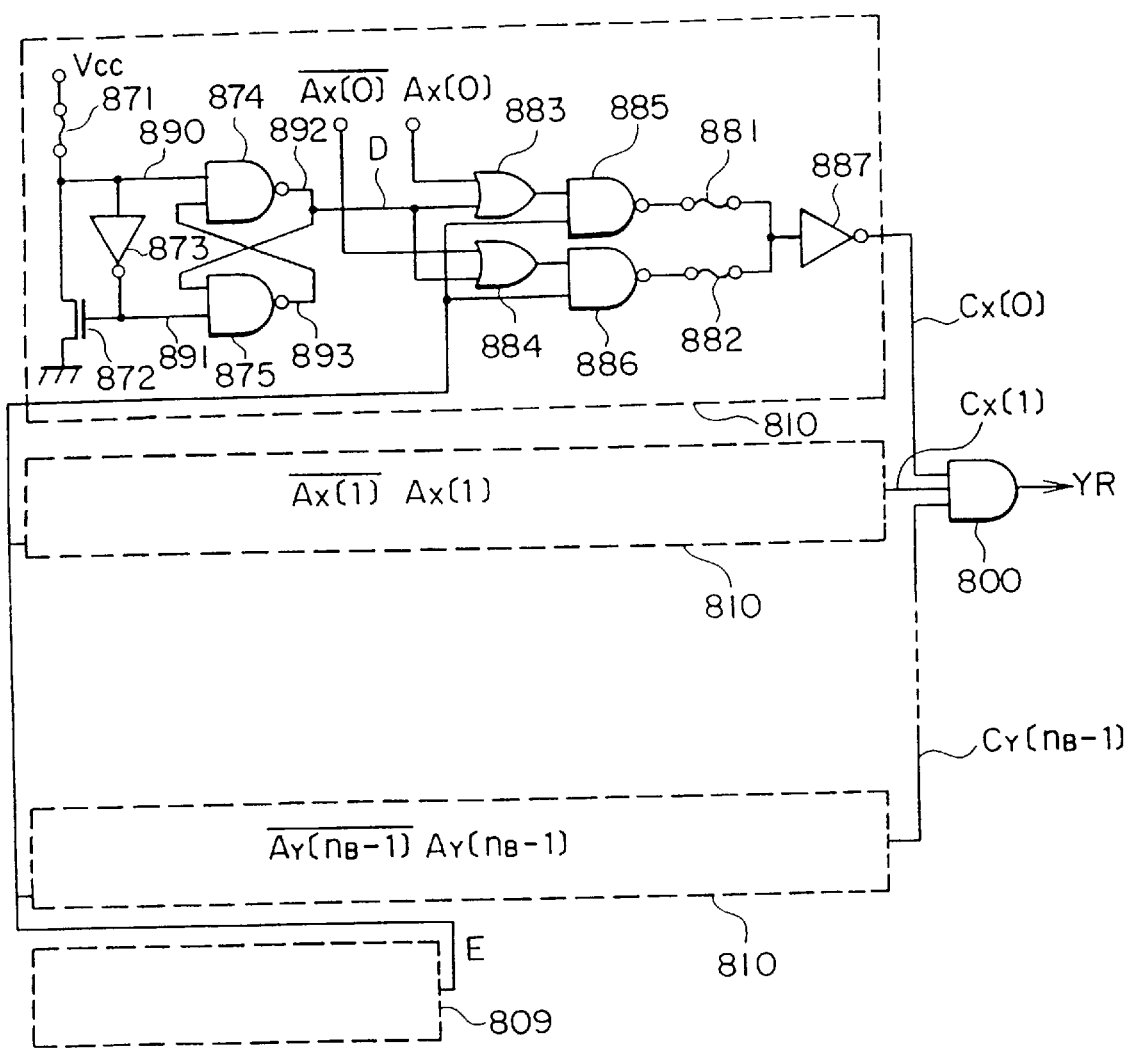
FIG. 31 is a diagram showing the fourth embodiment of an address comparing circuit used in the present invention.

FIG. 31 shows the fourth embodiment of an address comparing circuit. The present embodiment is different from the embodiment of FIG. 30 in circuit configuration of each bit comparing circuit 810. In FIG. 31, reference numerals 871, 881 and 882 designate fuses which can be blown by a laser beam, 872 an N-channel MOS transistors, 873 and 887 inverters, 874, 875, 885 and 886 NAND gates, and 883 and 884 OR gates. The operation of this bit comparing circuit will be explained below.

In a case where the value "X" is stored in the bit comparing circuit 810, the fuse 871 is blown. Thus, a node 890 is brought to a low potential level, a node 891 is put to a high potential level, a node 892 has a high potential level, and a node 893 has a low potential level. Accordingly, a don't-care signal D has a high level. Thus, an output $C_X[i]$ (or $C_Y[j]$) has a high level, independently of an applied address. In order to store a logical value "0" or "1" in the bit comparing circuit, the fuse 871 is not blown, and thus the don't-care signal D has a low level. In a case where the logical value "0" is stored, the fuse 881 is blown. Thus, when an applied address indicates the logical value "0", that is, when an address signal $A_X[i]$ (or $A_Y[j]$) has a low level, and the complement $\overline{A_X[i]}$ (or $\overline{A_Y[j]}$) of the address signal has a high level, the output $C_X[i]$ (or $C_Y[j]$) has the high level. In a case where the logical value "1" is stored, the fuse 882 is blown. Thus, when the applied address indicates the logical value "1", that is, when the address signal $A_X[i]$ (or $A_Y[j]$) has a high level, and the complement $\overline{A_X[i]}$ (or $\overline{A_Y[j]}$) of the address signal has a low level, the output $C_X[i]$ (or $C_Y[j]$) has the high level.

A feature of the present embodiment is that each of the values "0", "1" and "X" can be stored in the bit comparing circuit by blowing only a single fuse. In the embodiment of FIG. 30, each of these values is stored by blowing two fuses. Accordingly, the present embodiment can shorten a time necessary for repairing a defect in the course of the inspection of a semiconductor memory. Another feature of the present embodiment is that a plurality of bit comparing circuits can use the don't-care signal D in common, though such circuit connection is not shown in FIG. 31. For example, in a case where five kinds of replacement methods shown in FIG. 29 are carried out, a plurality of bit comparing circuits corresponding to the address signals $A_X[1]$ to $A_X[n_W-2]$ can use the don't-care signal in common. That is, only a single circuit part made up of circuit elements 871 to 875 is provided, and thus the area occupied by the address comparing circuit can be reduced.

Embodiment 5 of Address Comparing Circuit

Figure 32:
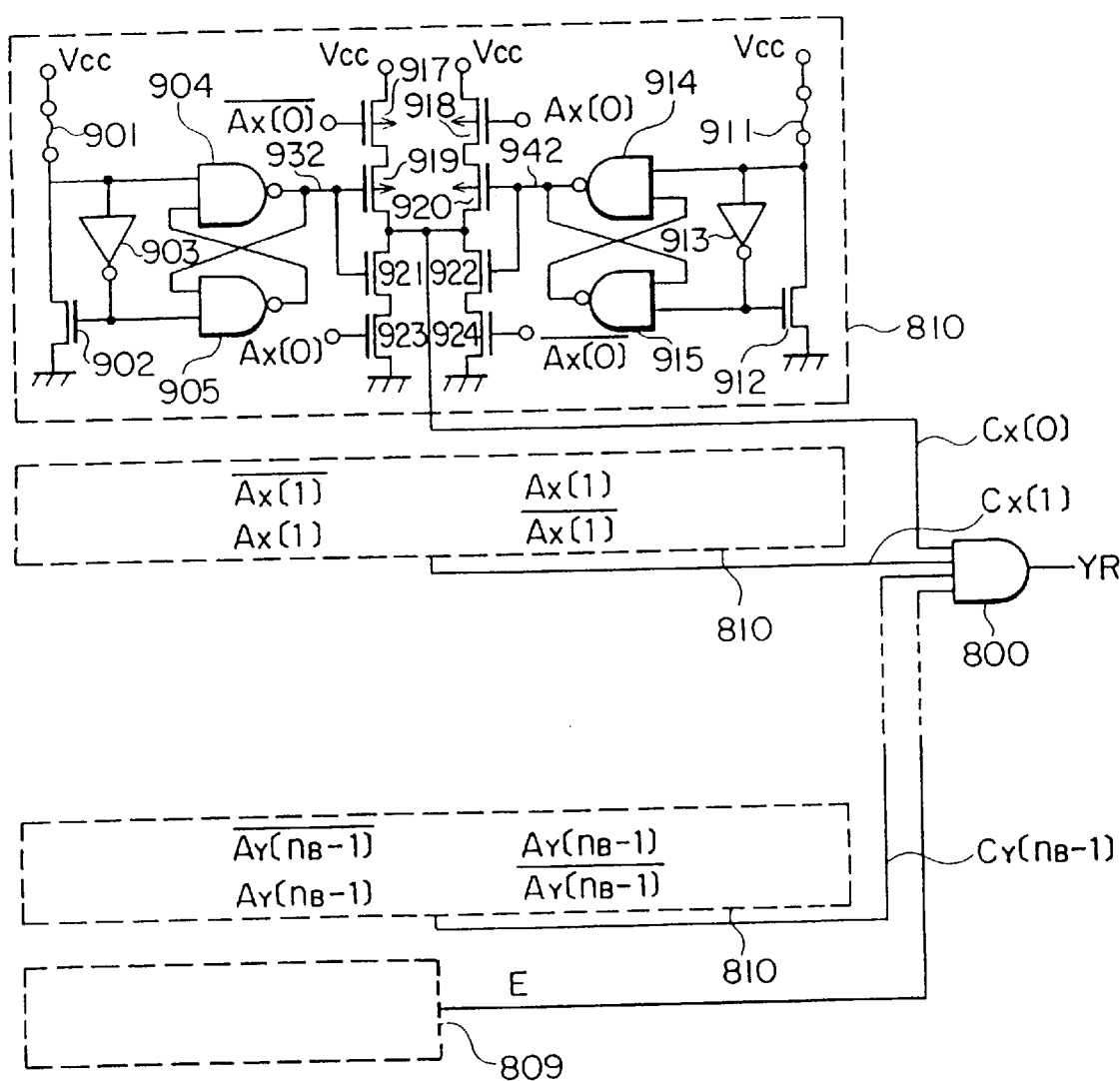
FIG. 32 is a diagram showing the fifth embodiment of an address comparing circuit used in the present invention.

FIG. 32 shows the fifth embodiment of an address comparing circuit. The present embodiment is different from the embodiment of FIG. 30, in circuit configuration of each bit comparing circuit 810. In FIG. 32, reference numerals 901 and 911 designate fuses which can be blown by a laser beam, 902 and 912 N-channel MOS transistors, 903 and 913 inverters, 904, 905, 914 and 915 NAND gates, 917, 918, 919 and 920 P-channel MOS transistors, and 921, 922, 923 and 924 N-channel MOS transistors. The operation of the bit comparing circuit will be explained below.

When the fuses 901 and 911 are not blown, nodes 932 and 942 are kept at a low potential level. Accordingly, the output $C_X[i]$ (or $C_Y[j]$) of the bit comparing circuit 810 has a high level, independently of an applied address. This indicates a state that the value "X" is stored. In a case where a logical value "0" is stored, the fuse 901 is blown. Thus, the node 932 has a high potential level, and the node 942 has a low potential level. Accordingly, when an address indicates the logical value "0", that is, when an address signal $A_X[i]$ (or $A_Y[j]$) has a low level, and the complement $\overline{A_X[i]}$ (or $\overline{A_Y[j]}$) of the address signal has a high level, the output $C_X[i]$ (or $C_Y[j]$) has the high level. In a case where a logical value "1" is stored, the fuse 911 is blown. Thus, the node 932 has the low potential level, and the node 942 has the high potential level. Accordingly, when the address indicates the logical value "1", that is, when the address signal $A_X[i]$ (or $A_Y[j]$) has the high level, and the complement $\overline{A_X[i]}$ (or $\overline{A_Y[j]}$) has the low level, the output $C_X[i]$ (or $C_Y[j]$) has the high level.

A feature of the present embodiment is that the number of fuses can be reduced, as compared with the embodiments of FIGS. 30 and 31, and thus an area occupied by the address comparing circuit can be reduced. Moreover, in a case where the value "X" is stored, it is not required to blow the fuses. Accordingly, a time necessary for repairing a defect can be shorter than that in the embodiments of FIGS. 30 and 31.

Another feature of the present embodiment is that when both of the fuses 901 and 911 are blown, the address comparing circuit concerned is made invalid. This is because the output $C_X[i]$ (or $C_Y[j]$) is always kept at the low level, and thus the output YR is always kept at the low level. This function can be used in a case where a spare memory cell substituted for a regular memory cell is defective. For example, let us consider a case where a defective regular bit line in the semiconductor memory of FIG. 21 is replaced by a spare bit line SB[0] with the aid of the address comparing circuit AC[0]. When the spare bit line SB[0] is found defective, the address comparing circuit AC[0] is invalidated in the above-mentioned manner, and one of the remaining address comparing circuits (for example, an address comparing circuit AC[2]) is used for replacing the defective regular bit line by a spare bit line SB[1].

In the third to fifth embodiments of an address comparing circuit, the don't-care value "X" can be stored in all the bit comparing circuits. In some cases, however, it is not required to store the value "X" in some of the bit comparing circuits. For example, in a case where five kinds of replacement methods shown in FIG. 29 are carried out, it is not required to store the value "X" in bit comparing circuits corresponding to address signals $A_Y[0]$ to $A_Y[n_B-1]$. In this case, an area occupied by the address comparing circuit can be reduced by using a bit comparing circuit incapable of storing the value "X" (for example, the bit comparing circuit of FIG. 19) as each of the bit comparing circuits corresponding to the address signals AY[0] to $A_Y[n_B-1]$. Further, in a case where only three kinds of replacement methods shown in the third to fifth columns of FIG. 29 are carried out (that is, single-bit and pair-bit defects are not repaired), each of bit comparing circuits corresponding to address signals $A_X[n_W-2]$ and $A_X[n_W-1]$ is formed of a circuit capable of storing the value "X", each of bit comparing circuits corresponding to address signals $A_Y[0]$ to $A_Y[n_B-1]$ is formed of a circuit incapable of storing the value "X", and bit comparing circuits corresponding to address signals $A_X[0]$ to $A_X[n_W-3]$ are omitted.

Embodiment 10

Figure 33:
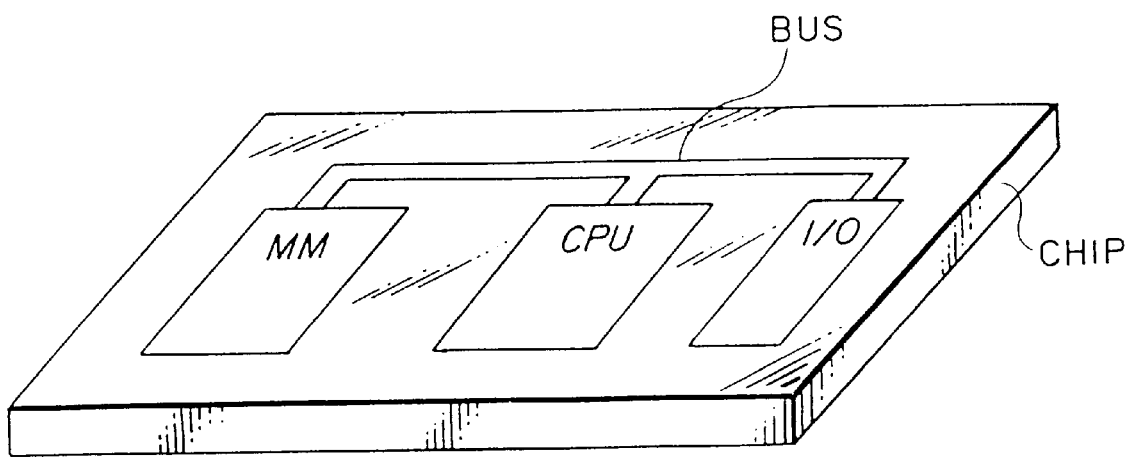
FIG. 33 is a diagram showing an embodiment of a one-chip microcomputer, to which the present invention is applied.

FIG. 33 shows an embodiment of a microcomputer according to the present invention. Referring to FIG. 33, a main memory MM, a central processing unit CPU and an input/output circuit I/O are formed on a single chip. The main memory MM is formed of one of the first to ninth embodiments of a semiconductor memory, and thus the manufacturing yields of the one-chip microcomputer is improved in a great degree.

According to the present invention, the number of memory cells which are simultaneously replaced by spare memory cells to repair a defect, is reduced. Thus, the probability that a defective memory cell is included in the spare memory cells, is reduced, and moreover the utilization efficiency of the spare memory cells is enhanced. Further, it is possible to increase the degree of freedom in determining the number of spare bit lines included in each memory mat and the number of address comparing circuit. Thus, a redundancy control circuit can be formed which is small in area, and can improve the manufacturing yields of a semiconductor memory in a great degree.

It is further understood by those skilled in the art that the foregoing description shows only preferred embodiments of the disclosed device and that various changes and modifications may be made in the invention without departing from the spirit and scope thereof.

We claim:

1. A semiconductor memory comprising:
   a plurality of memory mats, each having a plurality of word lines, a plurality of bit lines, a spare bit line, and a plurality of memory cells;
   a plurality of bit line selection lines, each coupled to respective ones of the plurality of bit lines of said plurality of memory mats;
   a spare bit line selection line coupled to the spare bit lines of said plurality of memory mats; and
   a redundancy circuit having an output node coupled to said spare bit line selection line and input nodes to which an information indicating one of said plurality of bit line selection lines and one of said plurality of memory mats is supplied,
   wherein said redundancy circuit includes a comparing circuit having first input nodes coupled to the input nodes of said redundancy circuit, a memory for storing a defect information to be compared with signals supplied to the first input nodes, and a first output node coupled to the output node of said redundancy circuit,
   wherein the memory has a first region to store a first information indicating one of said plurality of bit line selection lines which is associated with a defect and a second region for storing a second information indicating one of said plurality of memory mats which is associated with the defect, and
   wherein one of said plurality of memory mats is selected and one of said plurality of word lines of the selected memory mats is activated at a memory access.

2. The semiconductor memory according to claim 1, further comprising:
   a Y-decoder having input nodes to which a column address is supplied and output nodes which are coupled to said plurality of bit line selection lines; and
   an X-decoder having input nodes to which a row address is supplied and output nodes which are coupled to said plurality of word lines of said plurality of memory mats.

3. The semiconductor memory according to claim 2, wherein the information supplied to the input nodes of said redundancy circuit is related to both the column address and a part of the row address,
   wherein the first information is related to the column address, and
   wherein the second information is related to the said part of the row address.

4. The semiconductor memory according to claim 3, wherein each of the first and second regions of the memory contains fuses.

5. The semiconductor memory according to claim 4, further comprising:
   a plurality of address input terminals to which each of the row address and the column address is supplied under control of an address multiplex system, and
   wherein the semiconductor memory is a dynamic random access memory in a single chip device.

6. The semiconductor memory according to claim 1, further comprising:
   a plurality of address input terminals to which each of a row address and a column address is supplied under control of an address multiplex system, and
   wherein the first information is related to the column address and the second information is related to a part of the row address,
   wherein each of the plurality of memory cells is a dynamic memory cell, and
   wherein each of the first and second regions of the memory contains fuses.

7. A semiconductor memory comprising:
   a plurality of memory mats, each having a plurality of word lines, a plurality of bit lines, a first spare bit line, a second spare bit line and a plurality of memory cells;
   a plurality of bit line selection lines, each coupled to respective ones of the plurality of bit lines of said plurality of memory mats;
   a first spare bit line selection line coupled to the first spare bit lines of said plurality of memory mats;
   a second spare bit line selection line coupled to the second spare bit lines of said plurality of memory mats; and
   a redundancy circuit having a first output node coupled to said first spare bit line selection line, a second output node coupled to said second spare bit line selection line, and input nodes to which an information indicating one of said plurality of bit line selection lines and one of said plurality of memory mats is supplied,
   wherein said redundancy circuit includes:
      a first comparing circuit having first input nodes coupled to the input nodes of said redundancy circuit, a first memory for storing a first defect information to be compared with signals supplied to the first input nodes, and a first output node coupled to the first output node of said redundancy circuit; and
      a second comparing circuit having second input nodes coupled to the input nodes of said redundancy circuit, a second memory for storing a second defect information to be compared with signals supplied to the second input nodes, and a second output node coupled to the second output node of said redundancy circuit,
   wherein each of the first and second memories has a first region for storing a first information indicating one of said plurality of bit line selection lines which is associated with a defect and a second region for storing a second information indicating one of said plurality of memory mats which is associated with the defect, and
   wherein one of said plurality of memory mats is selected and one of said plurality of word lines of the selected memory mat is activated at a memory access.

8. The semiconductor memory according to claim 7, further comprising:
   a Y-decoder having input nodes to which a column address is supplied and output nodes which are coupled to said plurality of bit line selection lines; and
   an X-decoder having input nodes to which a row address is supplied and output nodes which are coupled to said plurality of word lines of said plurality of memory mats.

9. The semiconductor memory according to claim 8, wherein the information supplied to the input nodes of said redundancy circuit is related to both the column address and a part of the row address, wherein the first information is related to the column address, and wherein the second information is related to the said part of the row address.

10. The semiconductor memory according to claim 9, wherein each of the first and second regions of the first and second memories contains fuses.

11. The semiconductor memory according to claim 10, further comprising:

a plurality of address input terminals to which each of the row address and the column address is supplied under control of an address multiplex system, and wherein the semiconductor memory is a dynamic random access memory in a single chip device.

12. The semiconductor memory according to claim 7, further comprising:

a plurality of address input terminals to which each of a row address and a column address is supplied under control of an address multiplex system, and wherein the first information is related to the column address and the second information is related to a part of the row address, wherein each of the plurality of memory cells is a dynamic memory cell, and wherein each of the first and second regions of the memory contains fuses.

* * * * *